(12) United States Patent
Yang et al.

(10) Patent No.: US 12,205,898 B2
(45) Date of Patent: Jan. 21, 2025

(54) METAL-OXIDE-METAL CELL SEMICONDUCTOR DEVICE AND METHOD

(71) Applicant: TAIWAN SEMICONDUCTOR MANUFACTURING COMPANY, LTD., Hsinchu (TW)

(72) Inventors: Chung-Chieh Yang, Hsinchu (TW); Chung-Ting Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 381 days.

(21) Appl. No.: 17/853,485

(22) Filed: Jun. 29, 2022

(65) Prior Publication Data
US 2023/0282580 A1 Sep. 7, 2023

Related U.S. Application Data

(60) Provisional application No. 63/322,870, filed on Mar. 23, 2022, provisional application No. 63/317,152, filed on Mar. 7, 2022.

(51) Int. Cl.
*H01L 23/528* (2006.01)
*H01L 23/522* (2006.01)
(Continued)

(52) U.S. Cl.
CPC ...... *H01L 23/5286* (2013.01); *H01L 23/5223* (2013.01); *H01L 23/5226* (2013.01);
(Continued)

(58) Field of Classification Search
CPC ............ H01L 23/5286; H01L 23/5223; H01L 23/5226; H01L 23/5283; H01L 28/75;
(Continued)

(56) References Cited

U.S. PATENT DOCUMENTS 9,177,908 B2 * 11/2015 Liaw .................. H01L 23/5223
2013/0175589 A1 7/2013 Chen

FOREIGN PATENT DOCUMENTS

CN 102456665 5/2012
CN 107633128 1/2018
(Continued)

OTHER PUBLICATIONS

Office Action dated Jul. 19, 2023, for corresponding case No. TW 111137366. (pp. 1-8).

*Primary Examiner* — Tu-Tu V Ho
(74) *Attorney, Agent, or Firm* — Hauptman Ham, LLP

(57) ABSTRACT

A semiconductor device includes a metal-oxide-metal (MOM) cell including a first bus at a first elevation and extending along a first direction, and a second bus at a second elevation, extending along a second direction different from the first direction, and electrically connected to the first bus through a via. The MOM cell also includes a first group of fingers at the first elevation and extending along the first direction; and a second group of fingers at the second elevation and extending along the second direction. Each finger of the first group of fingers is electrically connected to the second bus through a corresponding via, each finger of the second group of fingers is electrically connected to the first bus through a corresponding via, and each finger of the first group of fingers overlaps each finger of the second group of fingers.

20 Claims, 22 Drawing Sheets

(51) Int. Cl.
*H01L 49/02* (2006.01)
*G06F 30/392* (2020.01)
*G06F 30/3953* (2020.01)
*G06F 30/398* (2020.01)

(52) U.S. Cl.
CPC .......... *H01L 23/5283* (2013.01); *H01L 28/75* (2013.01); *G06F 30/392* (2020.01); *G06F 30/3953* (2020.01); *G06F 30/398* (2020.01)

(58) Field of Classification Search
CPC ................ G06F 30/392; G06F 30/398; G06F 30/3953
USPC ....................................................... 257/499
See application file for complete search history.

(56) References Cited

FOREIGN PATENT DOCUMENTS

| | | |
|---|---|---|
| CN | 111128952 | 5/2020 |
| TW | 1323508 | 4/2010 |

\* cited by examiner

METAL-OXIDE-METAL CELL SEMICONDUCTOR DEVICE AND METHOD

CROSS REFERENCE TO RELATED APPLICATIONS

This application claims the benefit of U.S. Provisional Application No. 63/317,152, filed on Mar. 7, 2022, and U.S. Provisional Application No. 63/322,870, filed on Mar. 23, 2022, the disclosure of each of which is hereby incorporated by reference in its entirety.

BACKGROUND

In system-on-chip applications, different capacitors for different functional circuits are integrated on a single chip to serve different purposes. For example, in mixed-signal circuits, capacitors are used as decoupling capacitors and high-frequency noise filters. Various types of capacitors such as metal-oxide-semiconductor (MOS), PN junction, polysilicon-insulator-polysilicon (PIP), metal-insulator-metal (MIM), and metal-oxide-metal (MOM) capacitors have therefore been developed to meet various needs. With constant development of semiconductor utilization, the development of integrated circuits (ICs) continues to increase both performance and miniaturization developments.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features may be arbitrarily increased or reduced for clarity of discussion.

DETAILED DESCRIPTION

Figure 1A:
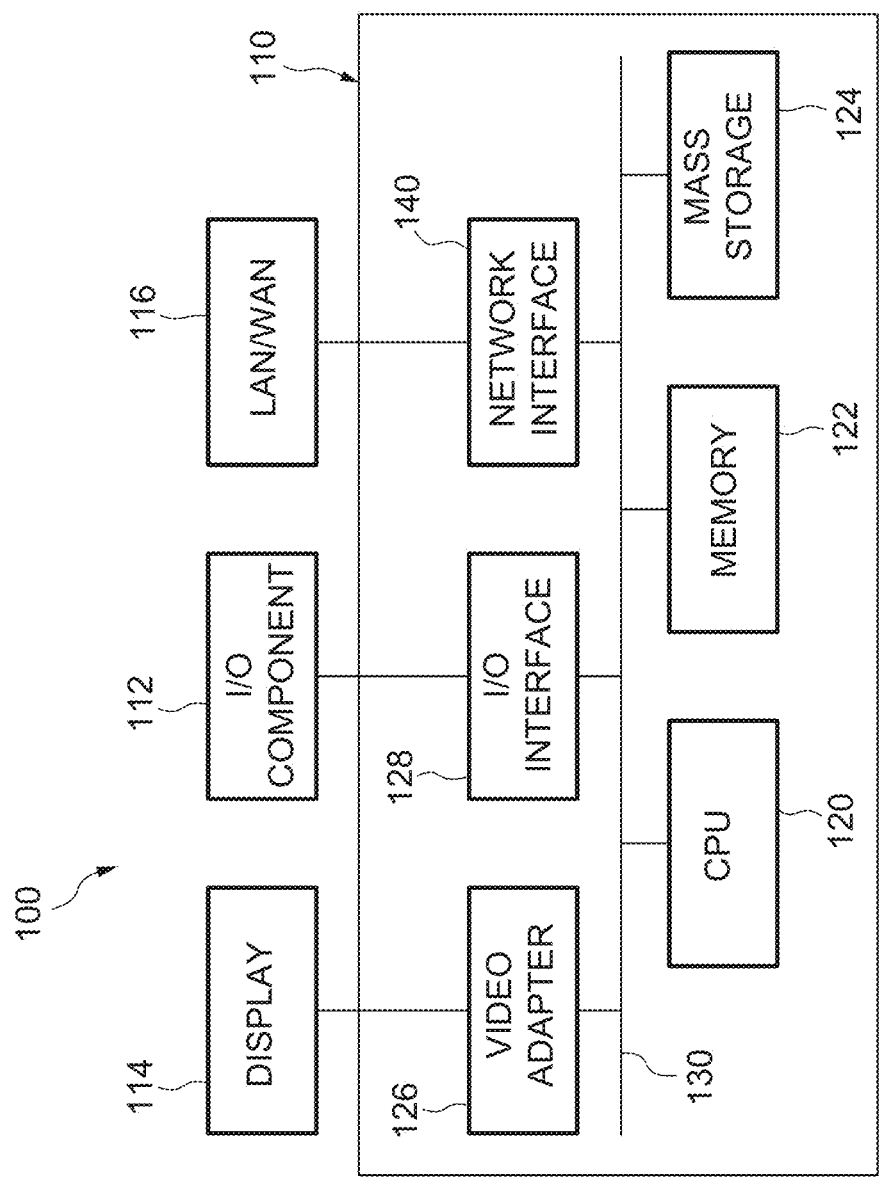
FIG. 1A is a block diagram of a processing system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90° or at other orientations) and the spatially relative descriptors used herein may likewise be interpreted accordingly.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

In various embodiments, a metal-oxide-metal (MOM) capacitive device is based on a cell structure in which an electrode includes a first bus and fingers in a first metal layer and a second bus and fingers in a second metal layer perpendicular to and overlapping the first bus and fingers. The electrode includes vias that electrically connect the first bus to the second bus and fingers, and electrically connect the second bus to the first bus and fingers. The electrode structure thereby enables a multi-cell capacitive device to include cells that are directly abutted by sharing the first and/or second buses, e.g., through adjacent cells having a mirror symmetry. Compared to approaches that do not include the electrode, e.g., approaches in which adjacent cells are separated by spaces, the MOM device is capable of having an increased density, thereby improving performance for a given area.

In some embodiments, direct abutment of adjacent cells and increased density are enabled by cells configured to avoid violation of one or more design rules of a manufacturing process used to create the MOM capacitive device, e.g., by matching bus spacing to a pitch of a metal layer adjacent to the first or second metal layer to avoid a metal/via overlap violation.

Figure 1B:
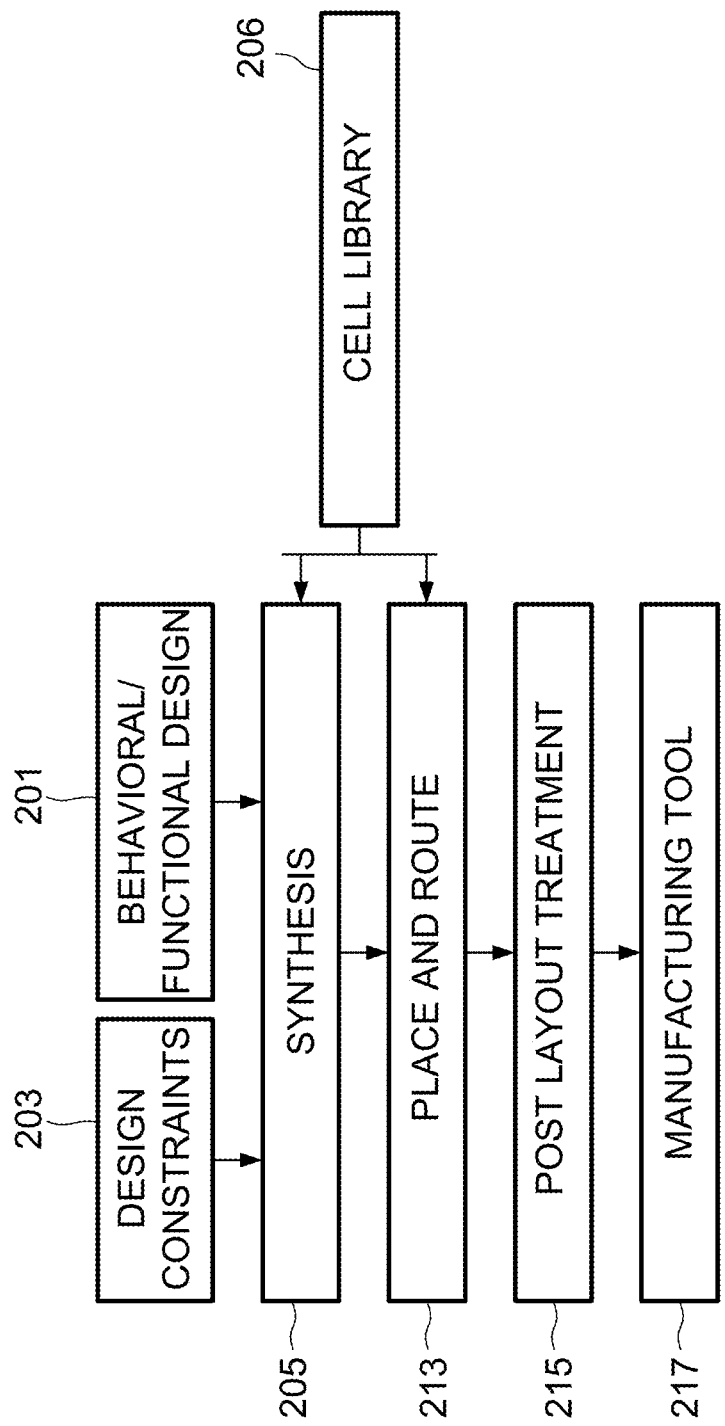
FIG. 1B is a flowchart used by an electronic design automation system in accordance with some embodiments.
Figure 4A:
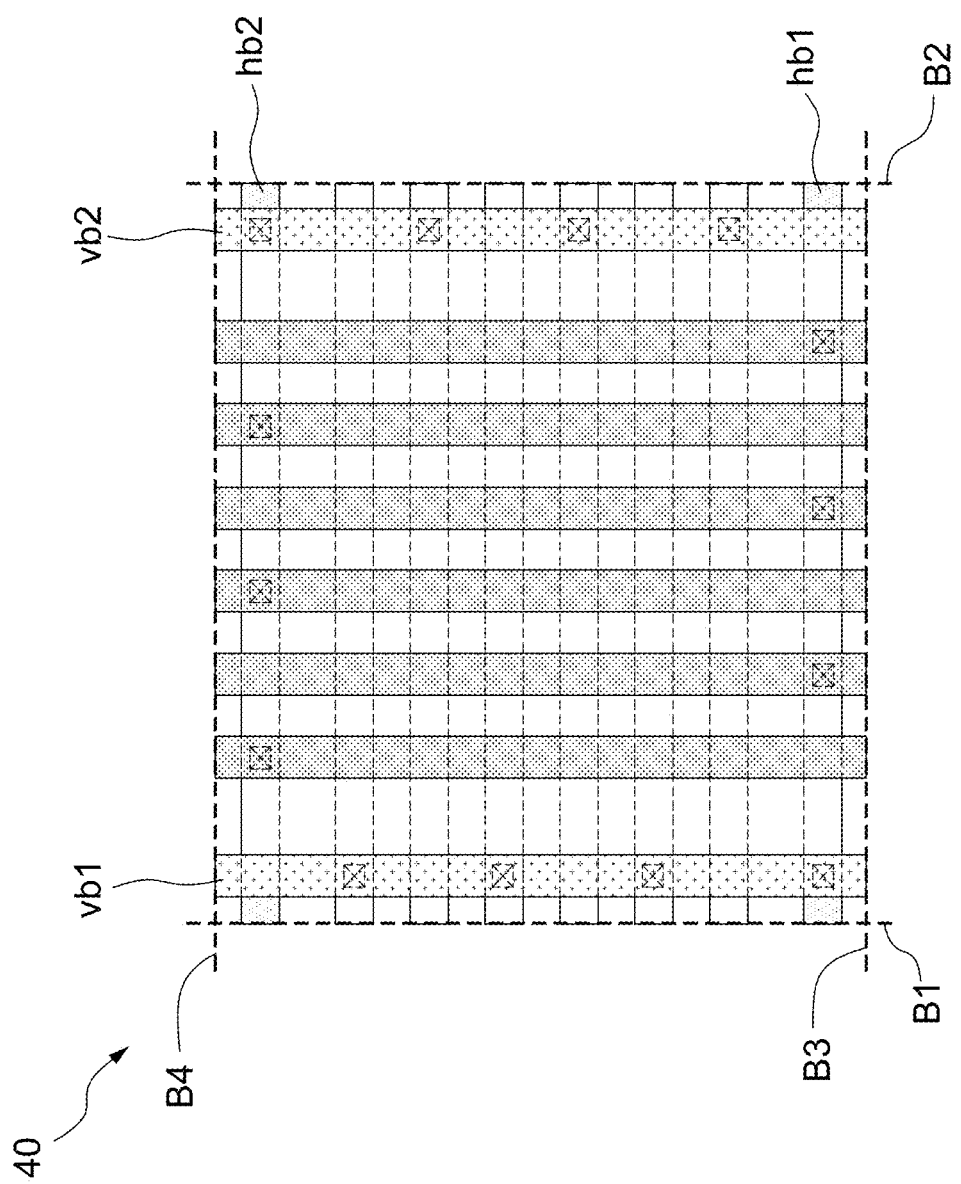
FIG. 4A illustrates a single cell in accordance with some embodiments.
Figure 4B:
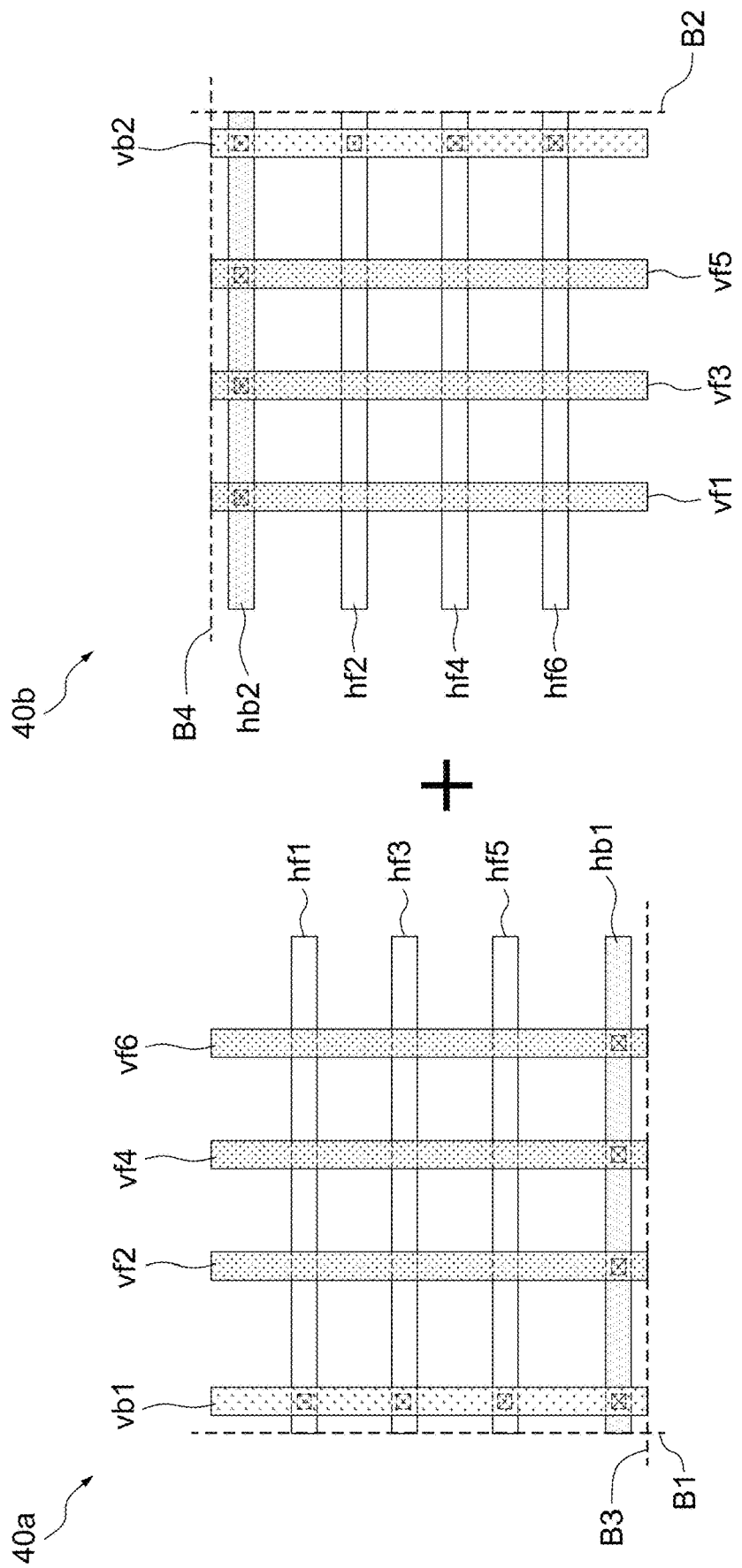
FIG. 4B illustrates an exemplary decomposition of a single cell, in accordance with some embodiments.
Figure 4C:
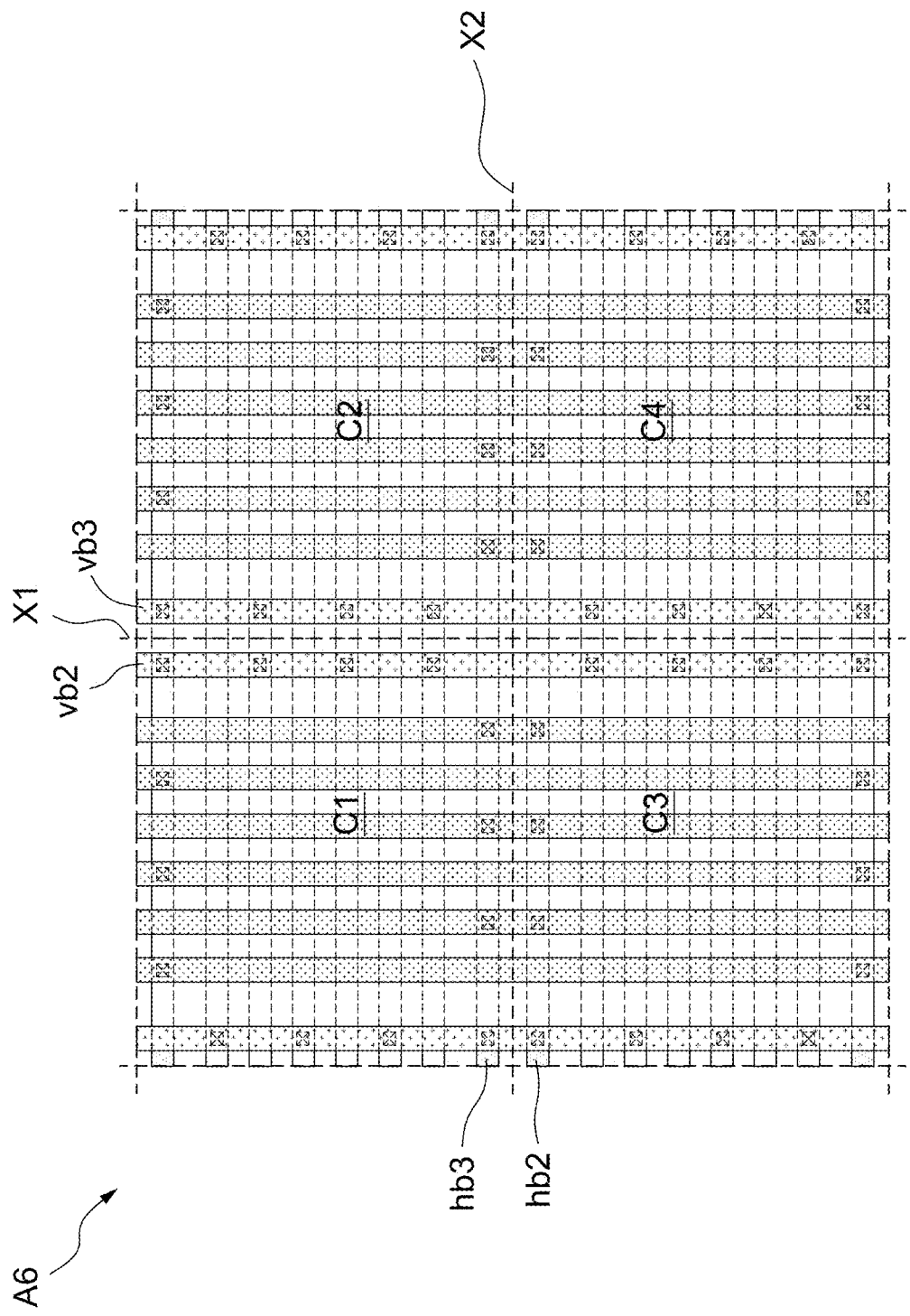
FIG. 4C illustrates a cell array in accordance with some embodiments.
Figure 5A:
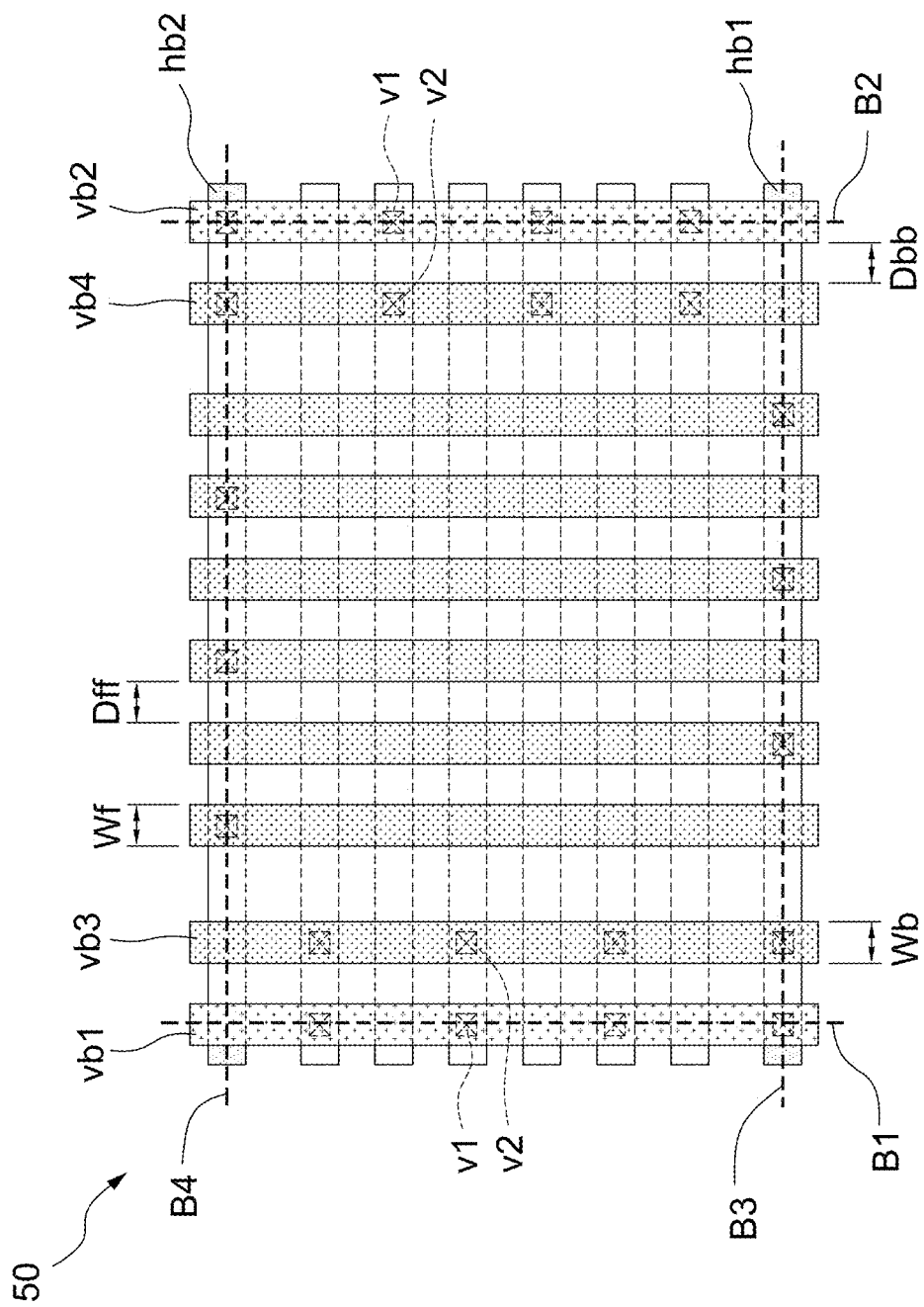
FIG. 5A illustrates a single cell in accordance with some embodiments.
Figure 5B:
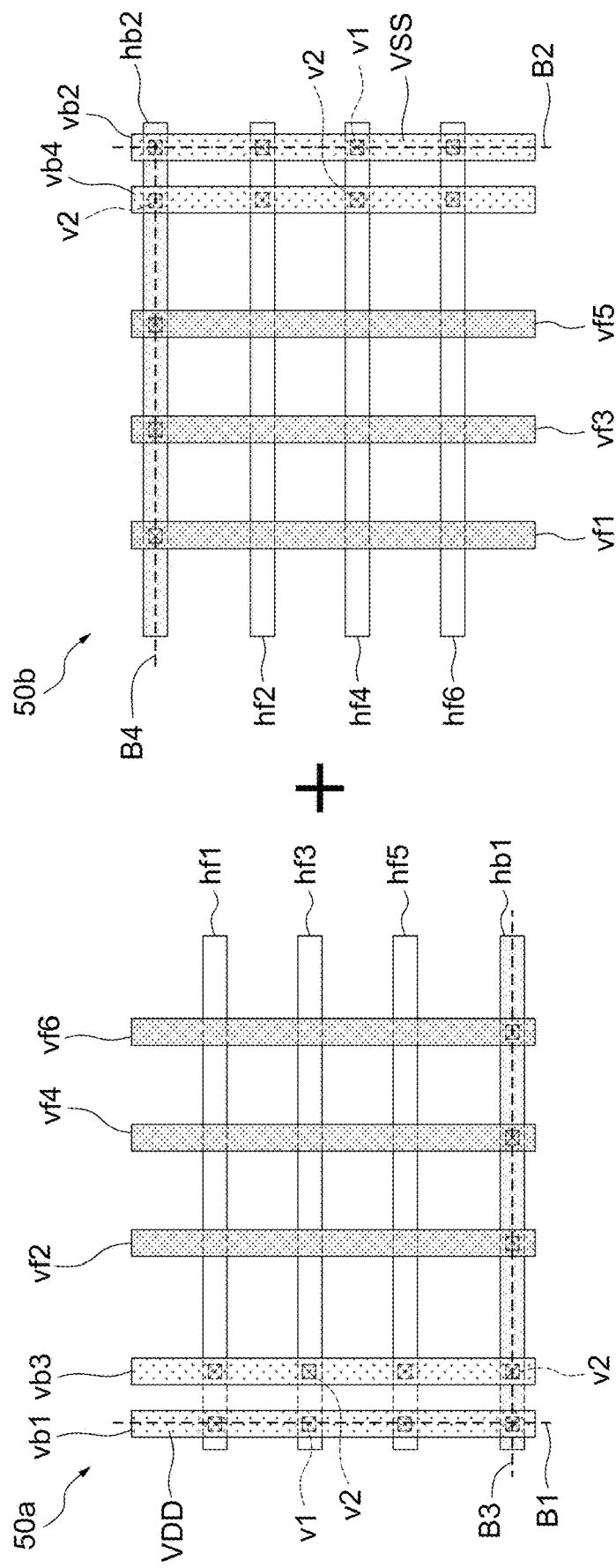
FIG. 5B illustrates an exemplary decomposition of a single cell, in accordance with some embodiments.
Figure 5C:
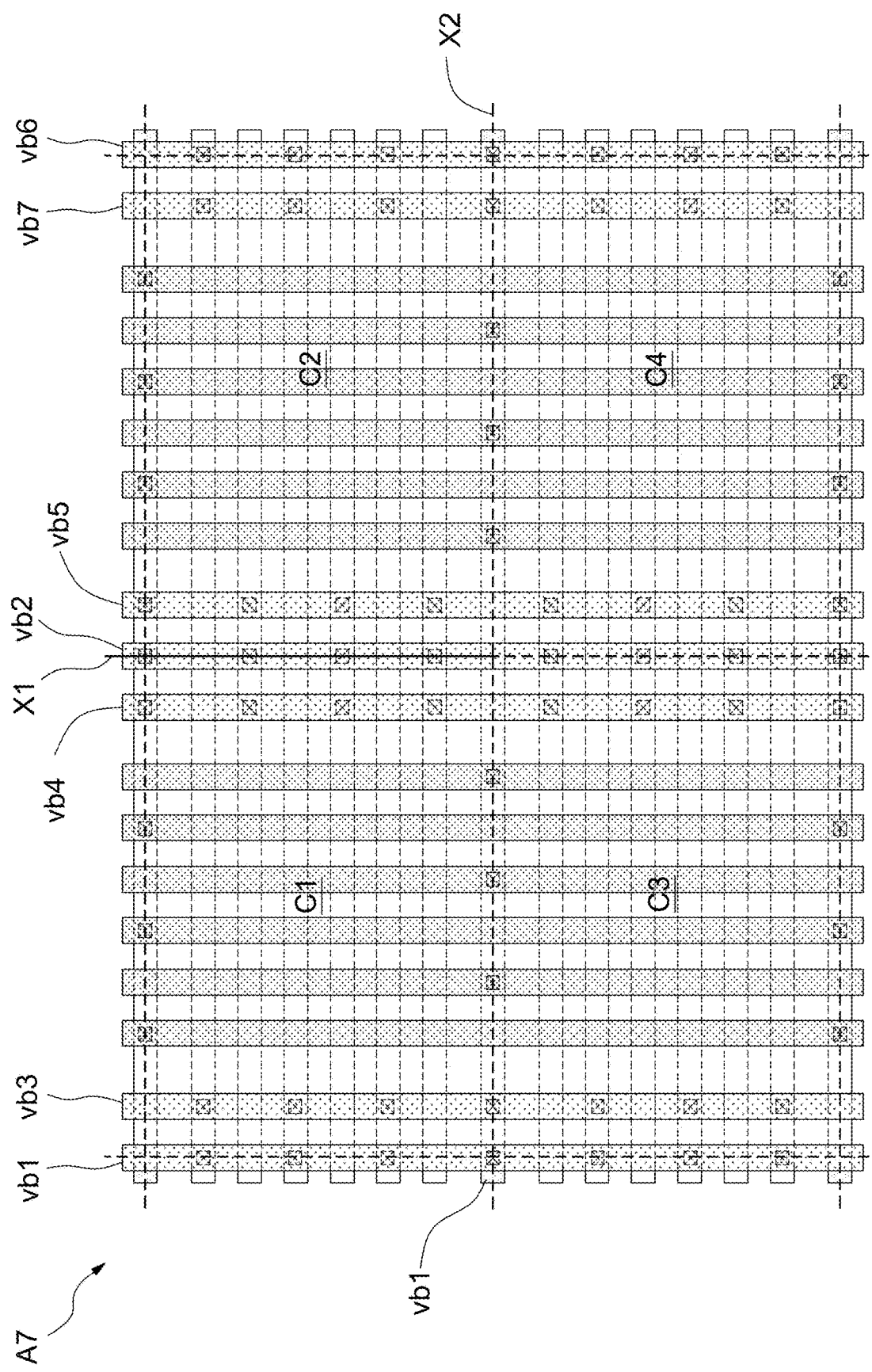
FIG. 5C illustrates a cell array in accordance with some embodiments.
Figure 6:
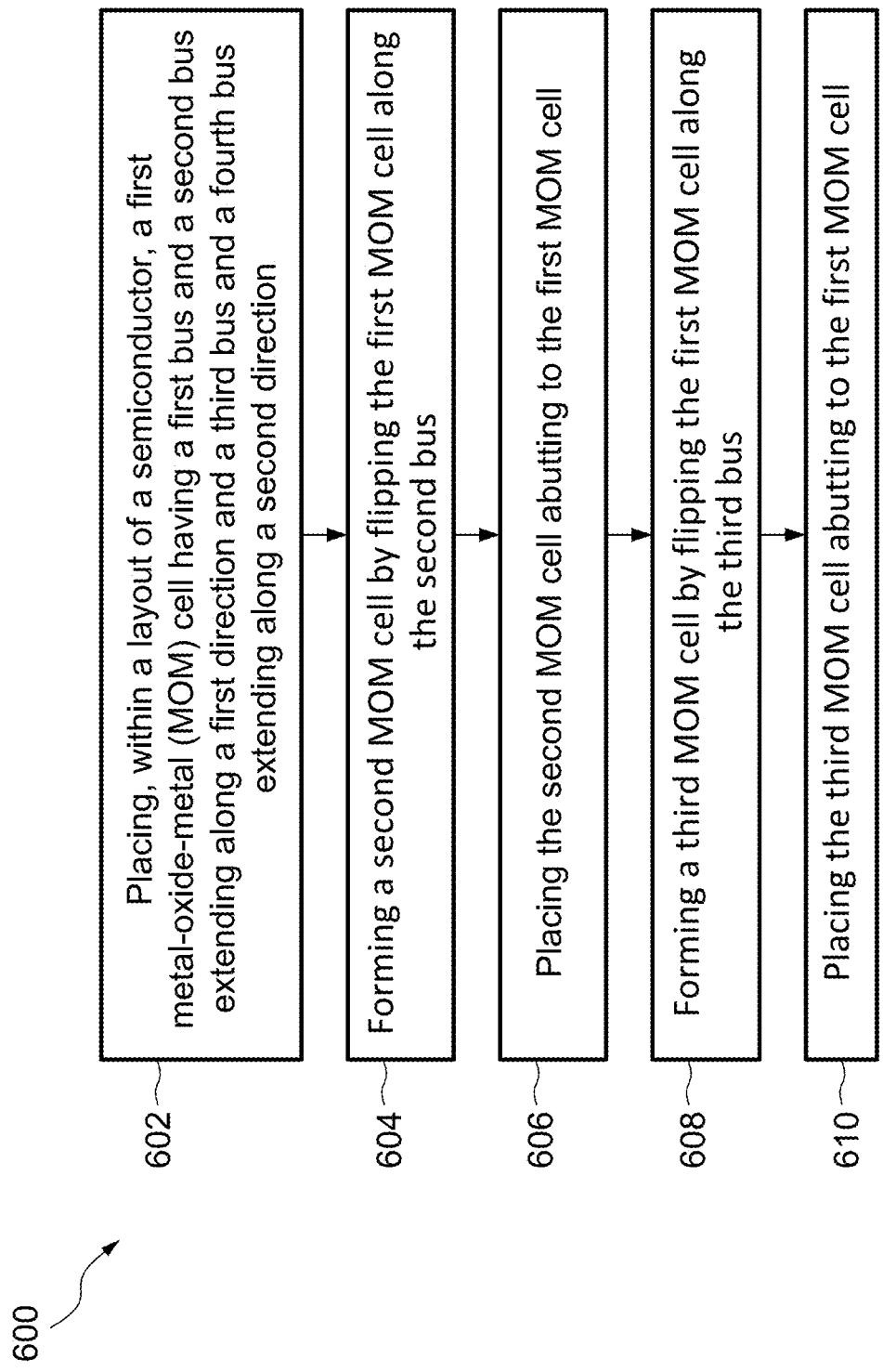
FIG. 6 is a flowchart of a method of arranging metal-oxide-metal (MOM) cells within a semiconductor device layout, in accordance with some embodiments of the present disclosure.
Figure 7:
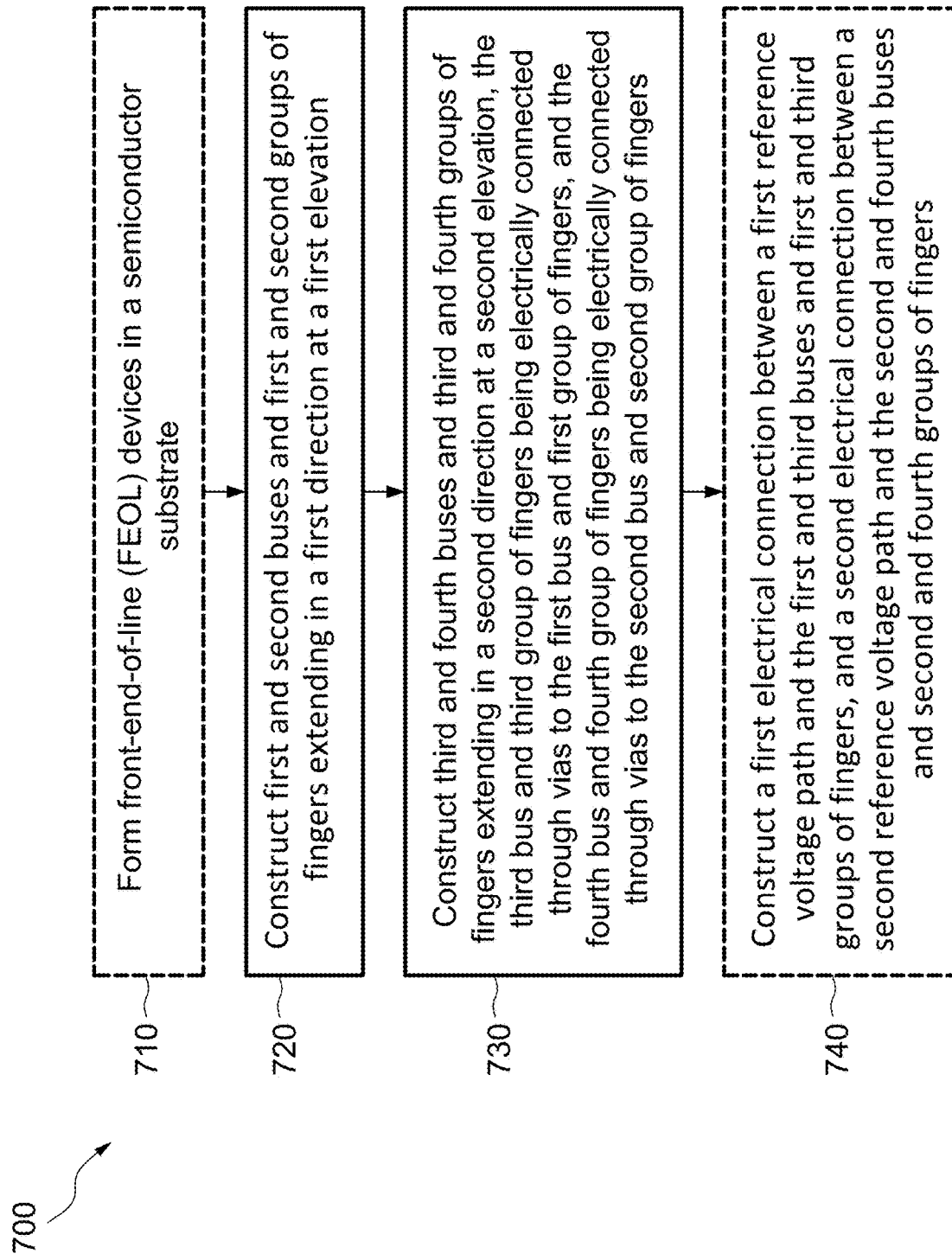
FIG. 7 is a flowchart of a method of manufacturing a semiconductor device, in accordance with some embodiments.
Figure 8:
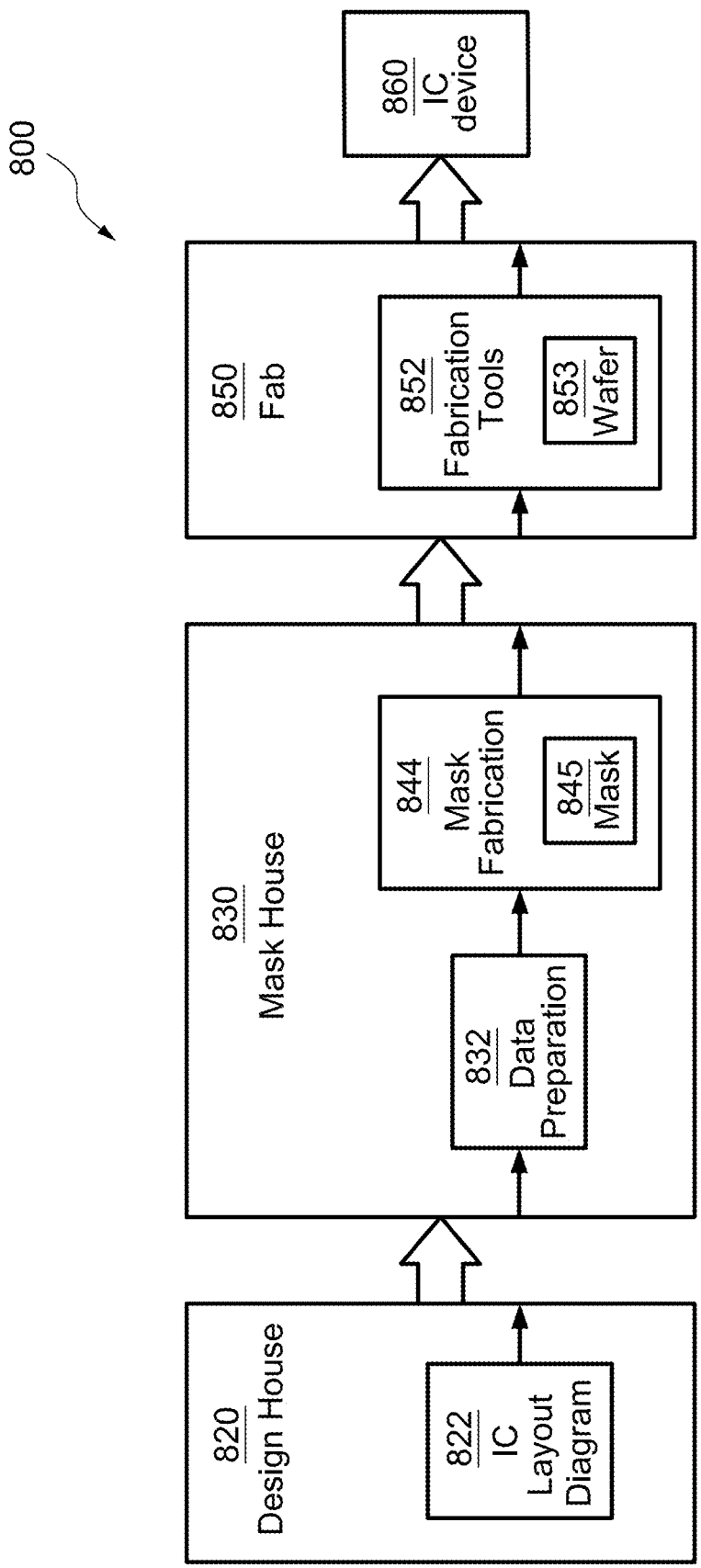
FIG. 8 is a block diagram of an IC manufacturing system, and an IC manufacturing flow associated therewith, in accordance with some embodiments.

As discussed below, FIGS. 1A and 1B are directed to an applicable IC layout system and design flow, FIGS. 2A-5C depict configurations corresponding to both layouts and structures of the various MOM embodiments, FIG. 6 is directed to an applicable layout generation method, and FIGS. 7 and 8 are directed to applicable manufacturing methods.

FIG. 1A illustrates a block diagram of a processing system in accordance with some embodiments.

Referring now to FIG. 1A, a block diagram of a processing system 100, such as an electronic design automation (EDA) processing system, is provided in accordance with an embodiment. The processing system 100 is a general purpose computer platform and may be used to implement any or all of the processes discussed herein or is a dedicated computer platform for performing electronic design. The processing system 100 may comprise a processing unit 110, such as a desktop computer, a workstation, a laptop computer, or a dedicated unit customized for a particular application. The processing system 100 may be equipped with a display 114 and one or more input/output devices 112, such as a mouse, a keyboard, or printer. The processing unit 110 may include a central processing unit (CPU) 120, memory 122, a mass storage device 124, a video adapter 126, and an I/O interface 128 connected to a bus 130.

The bus 130 may be one or more of any type of several bus architectures including a memory bus or memory controller, a peripheral bus, or video bus. The CPU 120 may comprise any type of electronic data processor, such as a microprocessor, and the memory 122 may comprise any type of system memory, such as static random access memory (SRAM), dynamic random access memory (DRAM), or read-only memory (ROM).

The mass storage device 124 may comprise any type of storage device configured to store data, programs, and other information and to make the data, programs, and other information accessible via the bus 130. The mass storage device 124 may comprise, for example, one or more of a hard disk drive, a magnetic disk drive, an optical disk drive, or the like.

The video adapter 126 and the I/O interface 128 provide interfaces to couple external input and output devices to the processing unit 110. As illustrated in FIG. 1A, examples of input and output devices include the display 114 coupled to the video adapter 126 and the I/O device 112, such as a mouse, keyboard, printer, and the like, coupled to the I/O interface 128. Other devices may be coupled to the processing unit 110, and additional or fewer interface cards may be utilized. For example, a serial interface card (not shown) may be used to provide a serial interface for a printer. The processing unit 110 also may include a network interface 140 that may be a wired link to a local area network (LAN) or a wide area network (WAN) 116 and/or a wireless link.

It can be contemplated that the processing system 100 may include additional components. For example, the processing system 100 may include power supplies, cables, a motherboard, removable storage media, cases, and the like. These other components, although not shown, are considered part of the processing system 100.

In an embodiment, an EDA is program code that is executed by the CPU 120 to analyze a user file to obtain an integrated circuit layout (described further below with respect to FIG. 1B). Further, during the execution of the EDA, the EDA may analyze functional components of the layout. The program code may be accessed by the CPU 120 via the bus 130 from the memory 122, mass storage device 124, or the like, or remotely through the network interface 140.

FIG. 1B illustrates one possible flow used by the EDA in an embodiment to automatically generate a physical layout from a user supplied behavioral/functional design 201. The behavioral/functional design 201 specifies the desired behavior or function of the circuit based upon various signals or stimuli applied to the inputs of the overall design, and may be written in a suitable language, such as a hardware description language (HDL). The behavioral/functional design 201 may be uploaded into the processing unit 110 (see FIG. 1A) through the I/O interface 128, such as by a user creating the file while the EDA is executing. Alternatively, the behavioral/functional design 201 may be uploaded and/or saved on the memory 122 or mass storage device 124, or the behavioral/functional design 201 may be uploaded through the network interface 140 from a remote user (see FIG. 1A). In these instances, the CPU 120 will access the behavioral/functional design 201 during execution of the EDA.

Additionally, the user also provides a set of design constraints 203 in order to constrain the overall design of the physical layout of the behavioral/functional design 201. The design constraints 203 may be input, for example, through the I/O interface 128, downloading through the network interface 140, or the like. The design constraints 203 may specify timing and other suitable constraints for the behavioral/functional design 201, once physically formed into an integrated circuit, to comply.

The EDA uses the behavioral/functional design 201 and the design constraints 203 and performs a synthesis 205 to create a functionally equivalent logic gate-level circuit description, such as a netlist. The synthesis 205 forms the functionally equivalent logic gate-level circuit description by matching the behavior and/or functions desired from the behavioral/functional design 201 to standard cells from cell libraries 206, which meet the design constraints 203.

The cell libraries 206 may include one or more individual cell libraries. Each of the individual cell libraries contains a listing of pre-designed components, called cells, each of which may perform a discrete logic function on a small scale. The cell is stored in the individual cell libraries as information comprising internal circuit elements, the various connections to these circuit elements, a pre-designed physical layout pattern that includes the height of each cell along with the cells' designed power rails, dopant implants, wells, and the like. Additionally, the stored cell may also comprise a shape of the cell, terminal positions for external connections, delay characteristics, power consumption, and the like.

Once the synthesis 205 creates the functionally equivalent logic gate-level circuit description from the behavioral/functional design 201 and the design constraints 203 by using one or more of the cell libraries 206, a place and route 213 is performed to create an actual physical design for the overall structure. The place and route 213 forms the physical design by taking the chosen cells from the cell libraries 206 and placing them into cell rows. The placement of each individual cell within the cell rows, and the placement of each cell row in relation to other cell rows, may be guided by cost functions in order to minimize wiring lengths and area desires of the resulting integrated circuit. This placement may be done either automatically by the place and route 213, or else may alternatively be performed partly through a manual process, whereby a user may manually insert one or more cells into a row.

After the initial placement of the individual cells, a post layout treatment 215 is performed. In an embodiment the post layout treatment 215 is a treatment that occurs after the placement of the individual cells and is a treatment which analyzes the vias along the abutments between the individual cells and modifies these vias along the abutment in order to overcome restraints related to the physical limitations of lithography processes and which help generate a higher density cell.

Once a physical design layout has been generated by the place and route 213 and the post layout treatment 215 has occurred, the physical design may be sent to a manufacturing tool 217 to generate, e.g., photolithographic masks, that may be used in the physical manufacture of the desired design. The physical design layout may be sent to the manufacturing tool 217 through that LAN/WAN 166 or other suitable forms of transmission from the EDA to the manufacturing tool 217.

Figure 2A:
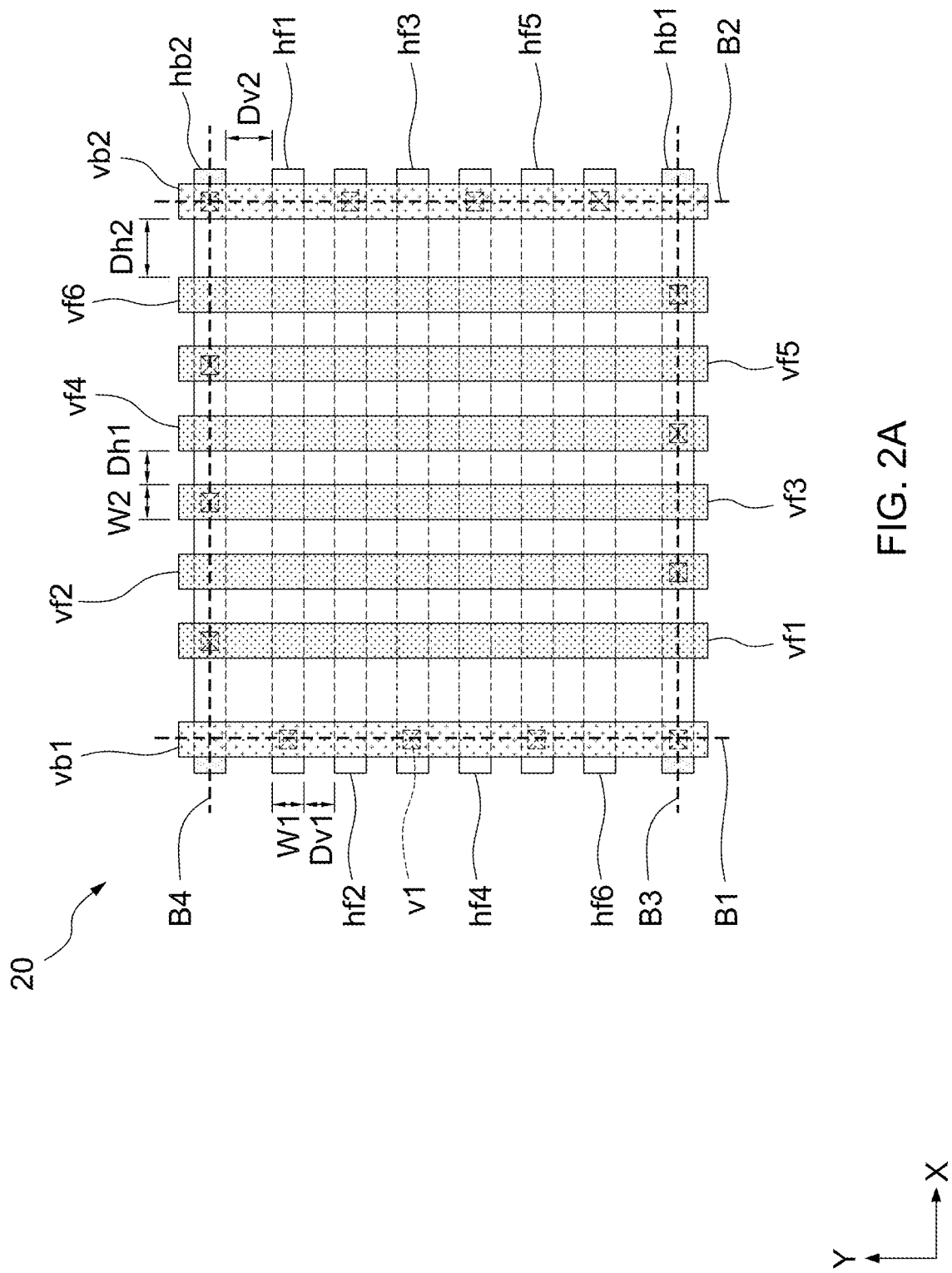
FIG. 2A illustrates a single cell in accordance with some embodiments.

FIG. 2A illustrates a single cell 20 in accordance with some embodiments that may be stored in the cell libraries 206. The cell 20 is a MOM capacitor cell. The cell 20 is arranged within cell boundaries B1, B2, B3, and B4.

The cell 20 includes buses vb1, vb2, hb1, and hb2. The buses vb1 and vb2 can each be referred to as a vertical bus, and the buses hb1 and hb2 can each be referred to as a horizontal bus. The buses vb1 and vb2 can be substantially parallel. The buses hb1 and hb2 can be substantially parallel. The buses vb1 and vb2 can be substantially perpendicular to the buses hb1 and hb2. The bus vb1 is aligned with the boundary B1. The bus vb2 is aligned with the boundary B2. The bus hb1 is aligned with the boundary B3. The bus hb2 is aligned with the boundary B4.

The buses hb1, hb2, vb1, and vb2 can comprise conductive materials. In some embodiments, the buses hb1, hb2, vb1, and vb2 can be made of conductive material, such as aluminum (Al), copper (Cu), tungsten (W), titanium (Ti), tantalum (Ta), or other applicable materials. The buses hb1, hb2, vb1, and vb2 are configured to receive reference voltages. For example, the buses hb1, hb2, vb1, and vb2 can be configured to receive reference voltages VDD or VSS.

The cell 20 includes fingers hf1, hf2, hf3, hf4, hf5 and hf6 extending along a horizontal axis (e.g., the X axis). The cell 20 includes fingers vf1, vf2, vf3, vf4, vf5 and vf6 extending along a vertical axis (e.g., the Y axis). The fingers hf1, hf2, hf3, hf4, hf5 and hf6 are disposed at the same elevation as the buses hb1 and hb2. The fingers vf1, vf2, vf3, vf4, vf5 and vf6 are disposed at the same elevation as the buses vb1 and vb2. In the embodiment shown in FIG. 2A, the fingers vf1, vf2, vf3, vf4, vf5 and vf6 and the buses vb1 and vb2 are disposed above the fingers hf1, hf2, hf3, hf4, hf5 and hf6 and the buses hb1 and hb2. The fingers vf1, vf2, vf3, vf4, vf5 and vf6 and the buses vb1 and vb2 can be disposed on a layer adjacent to the layer at which the fingers hf1, hf2, hf3, hf4, hf5 and hf6 and the buses hb1 and hb2 are disposed.

The fingers hf1, hf2, hf3, hf4, hf5, hf6, vf1, vf2, vf3, vf4, vf5 and vf6 can comprise conductive materials. In some embodiments, the fingers hf1, hf2, hf3, hf4, hf5, hf6, vf1, vf2, vf3, vf4, vf5 and vf6 can be made of conductive material, such as aluminum (Al), copper (Cu), tungsten (W), titanium (Ti), tantalum (Ta), or other applicable materials. In some embodiments, the fingers hf1, hf2, hf3, hf4, hf5, hf6, vf1, vf2, vf3, vf4, vf5 and vf6 can be made of identical materials. In some embodiments, the fingers hf1, hf2, hf3, hf4, hf5 and hf6 can be made of materials different than those of the fingers vf1, vf2, vf3, vf4, vf5 and vf6.

Fingers and buses on different elevations can be electrically connected through, for example, a conductive via. Buses on different elevations can be electrically connected through, for example, a conductive via. Referring to FIG. 2A, the buses vb1 and hb1 are electrically connected through a conductive via v1. The fingers hf1, hf3, and hf5 are each electrically connected to the bus vb1 through a conductive via v1. The fingers hf2, hf4, and hf6 are each electrically connected to the bus vb2 through a conductive via v1. The fingers vf1, vf3, and vf5 are each electrically connected to the bus hb2 through a conductive via v1. The fingers vf2, vf4, and vf6 are each electrically connected to the bus hb1 through a conductive via v1.

The fingers hf1, hf2, hf3, hf4, hf5, and hf6 can each include a width W1. The fingers vf1, vf2, vf3, vf4, vf5, and vf6 can each include a width W2. In some embodiments, the width W1 can be substantially identical to the width W2. In other embodiments, the width W1 can be different from the width W2 to suit needs.

The fingers hf1, hf2, hf3, hf4, hf5, and hf6 can be spaced apart from each other by a constant distance (e.g., the distance Dv1). In other embodiments, the fingers hf1, hf2, hf3, hf4, hf5, and hf6 can be spaced apart from each other by different distances to suit needs. The fingers vf1, vf2, vf3, vf4, vf5, and vf6 can be spaced apart from each other by a constant distance (e.g., the distance Dh1). In other embodiments, the fingers vf1, vf2, vf3, vf4, vf5, and vf6 can be spaced apart from each other by different distances to suit needs.

The minimum distance between a bus and its adjacent finger, for example, the distance Dh2 between the finger vf6 and the bus vb2, can equal or exceed the distance between fingers (e.g., the distance Dh1). Similarly, the distance Dv2 between the finger hf1 and the bus hb2, can equal or exceed the distance between fingers (e.g., the distance Dv1).

A "VIA to line" space is usually taken into consideration in the fabrication of a semiconductor device. The increased space between a bus and its adjacent finger (e.g., Dh2) can enhance back-end-of-line (BEOL) breakdown voltage. In other words, the increased space between a bus and its adjacent finger may improve BEOL reliability.

From a top view perspective, the fingers hf1-hf6 each includes a first end overlapping with a portion of the bus vb1 and a second end overlapping with a portion of the bus vb2. From a top view perspective, the fingers vf1-vf6 each includes a first end overlapping with a portion of the bus hb1 and a second end overlapping with a portion of the bus hb2. From a top view perspective, the buses hb1 and hb2 each includes a first end overlapping with a portion of the bus vb1 and a second end overlapping with a portion of the bus vb2. From a top view perspective, the buses vb1 and vb2 each includes a first end overlapping with a portion of the bus hb1 and a second end overlapping with a portion of the bus hb2.

Figure 2B:
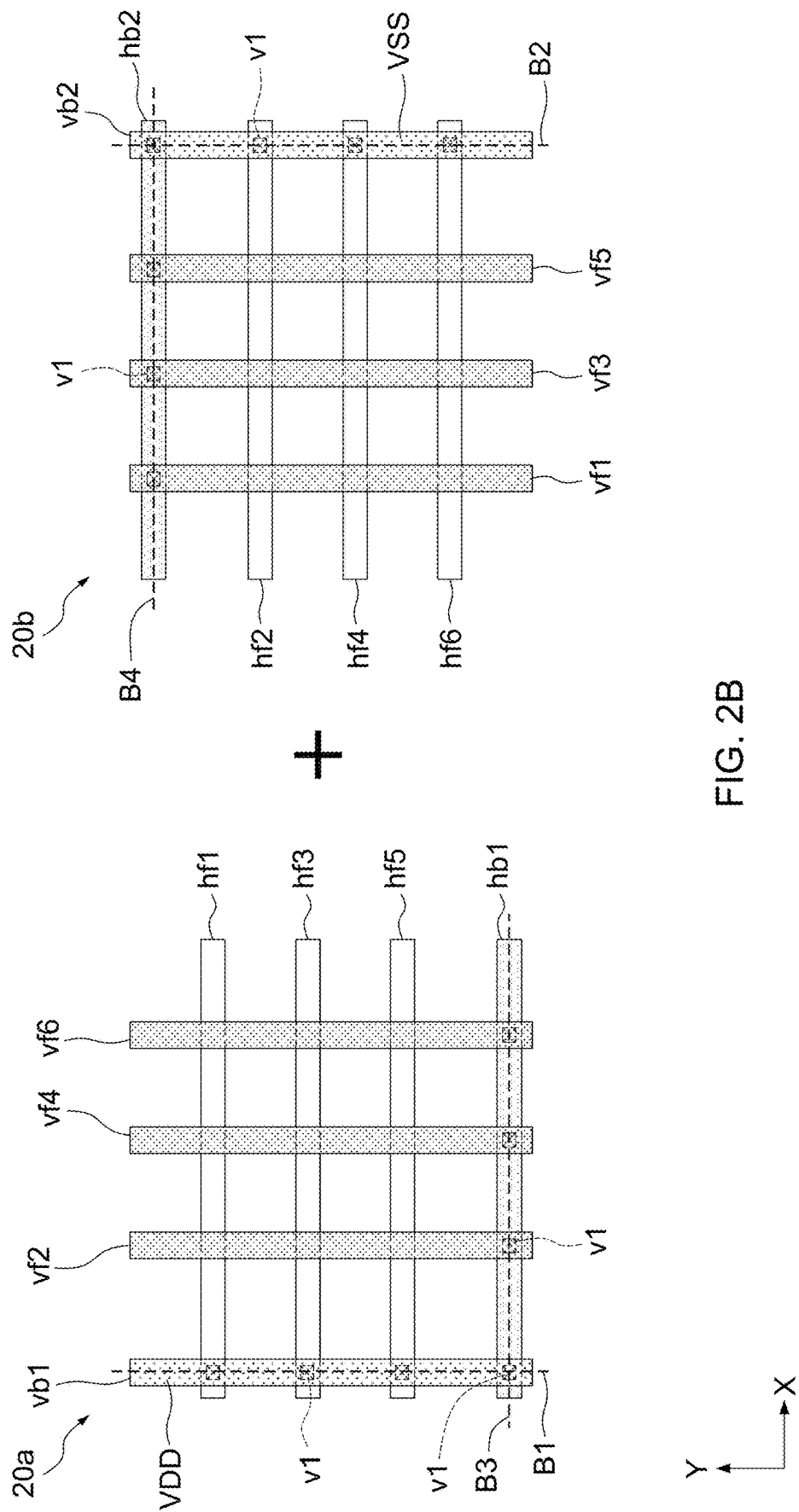
FIG. 2B illustrates an exemplary decomposition of a single cell, in accordance with some embodiments.

FIG. 2B illustrates an exemplary decomposition of a single cell, in accordance with some embodiments. FIG. 2B shows an exemplary decomposition of the cell 20. The cell 20 can include the conductive structures 20a and 20b. In some embodiments, the conductive structures 20a and 20b can each be referred to as an electrode or a plate. In some embodiments, the conductive structures 20a and 20b can each be referred to as a mesh electrode or a mesh plate.

The conductive structure 20a includes fingers at different elevations. The conductive structure 20a includes buses at different elevations. The bus hb1 and the fingers hf1, hf3, and hf5 are located at the same elevation. The bus vb1 and the fingers vf2, vf4, and vf6 are located at the same elevation. The fingers vf2, vf4, and vf6 and the bus vb1 are disposed above the fingers hf1, hf3, and hf5 and the bus hb1.

The bus vb1 can be electrically connected to the fingers hf1, hf3, and hf5 through conductive vias (e.g., v1). The bus vb1 can be electrically connected to the bus hb1 through a conductive via (e.g., v1). The bus hb1 can be electrically connected to the fingers vf2, vf4, and vf6 through conductive vias (e.g., v1). The bus hb1 can be electrically connected to the bus vb1 through a conductive via (e.g., v1). The bus vb1 is aligned with the cell boundary B1. The bus hb1 is aligned with the cell boundary B3.

The conductive structure 20a is configured to receive a reference voltage. In some embodiments, the conductive structure 20a can be configured to receive a reference voltage VDD. The reference voltage VDD can be applied to the conductive structure 20a through the bus vb1 or the bus hb1. All the fingers of the conductive structure 20a will be configured at a substantial identical electric potential.

The conductive structure 20b includes fingers at different elevations. The conductive structure 20b includes buses at different elevations. The bus hb2 and the fingers hf2, hf4, and hf6 are located at the same elevation. The bus vb2 and the fingers vf1, vf3, and vf5 are located at the same elevation. The fingers vf1, vf3, and vf5 and the bus vb2 are disposed above the fingers hf2, hf4, and hf6 and the bus hb2.

The bus vb2 can be electrically connected to the fingers hf2, hf4, and hf6 through conductive vias (e.g., v1). The bus vb2 can be electrically connected to the bus hb2 through a conductive via (e.g., v1). The bus hb2 can be electrically connected to the fingers vf1, vf3, and vf5 through conductive vias (e.g., v1). The bus hb2 can be electrically connected to the bus vb2 through a conductive via (e.g., v1). The bus vb2 is aligned with the cell boundary B2. The bus hb2 is aligned with the cell boundary B4.

The conductive structure 20b is configured to receive a reference voltage. In some embodiments, the conductive structure 20b can be configured to receive a reference voltage VSS. The reference voltage VSS can be applied to the conductive structure 20b through the bus vb2 or the bus hb2. All the fingers of the conductive structure 20b will be configured at a substantial identical electric potential.

Figure 2C:
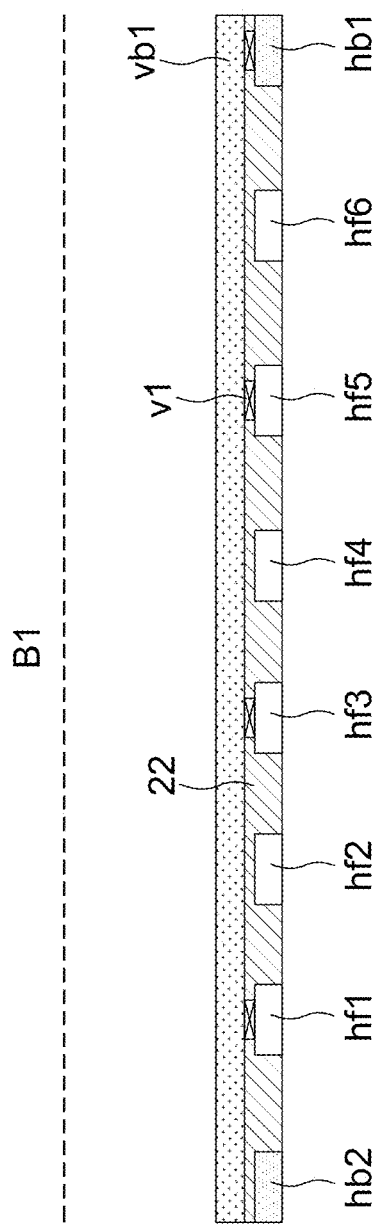
FIG. 2C is a cross section along the cell boundary B1 of FIG. 2A, in accordance with some embodiments.

FIG. 2C is a cross section along the cell boundary B1 of FIG. 2A, in accordance with some embodiments.

Referring to FIG. 2C, the bus vb1 is disposed above the buses hb1 and hb2 and the fingers hf1-hf6. The bus vb1 can be a conductive layer adjacent to a conductive layer at which the buses hb1 and hb2 and the fingers hf1-hf6 are disposed. The bus vb1 is electrically connected to the fingers hf1, hf3, and hf5 and the bus hb1.

Dielectric materials can be disposed within the space between the bus vb1 and the buses hb1 and hb2. Dielectric materials can be disposed within the space between the bus vb1 and the fingers hf1-hf6. The dielectric layer 22 surrounds the buses hb1 and hb2 and the fingers hf1-hf6. The dielectric layer 22 covers the buses hb1 and hb2 and the fingers hf1-hf6. The buses hb1 and hb2 and the fingers hf1-hf6 are embedded within the dielectric layer 22. The dielectric layer 22 can include, for example, silicon dioxide, glass, PTFE (Teflon), polyethylene (PE), polyimide, polypropylene, polystyrene, titanium dioxide, strontium titanate, barium strontium titanate, barium titanate, conjugated polymers, calcium copper titanate, or other applicable materials. In some embodiments, the dielectric layer 22 can be replaced by vacuum.

The buses vb1, hb1 and hb2 and the fingers hf1-hf6 can be formed at two arbitrary adjacent conductive layers within a semiconductor device. In some embodiments, the buses vb1, hb1 and hb2 and the fingers hf1-hf6 can be formed at metal layers M0 and M1. In some embodiments, the buses vb1, hb1 and hb2 and the fingers hf1-hf6 can be formed at metal layers M1 and M2. In some embodiments, the buses vb1, hb1 and hb2 and the fingers hf1-hf6 can be formed at metal layers M2 and M3. In some embodiments, the buses vb1, hb1 and hb2 and the fingers hf1-hf6 can be formed at metal layers M3 and M4. In some embodiments, the buses vb1, hb1 and hb2 and the fingers hf1-hf6 can be formed at two adjacent metal layers higher than the metal layer M4.

Figure 2D:
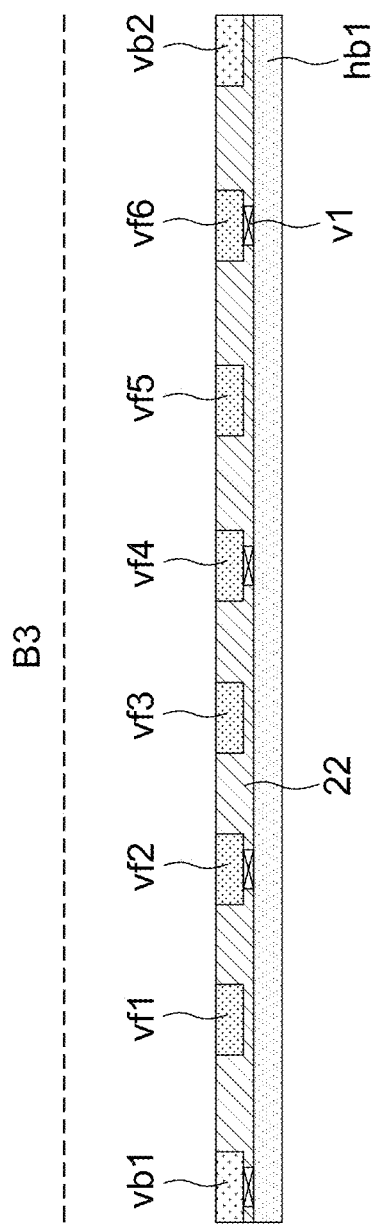
FIG. 2D is a cross section along the cell boundary B3 of FIG. 2A, in accordance with some embodiments.

FIG. 2D is a cross section along the cell boundary B3 of FIG. 2A, in accordance with some embodiments.

Referring to FIG. 2D, the buses vb1 and vb2 and the fingers vf1-vf6 are disposed above the bus hb1. The bus hb1 can be a conductive layer adjacent to a conductive layer at which the buses vb1 and vb2 and the fingers vf1-vf6 are disposed. The bus hb1 is electrically connected to the fingers vf1, vf3, and vf5 and the bus vb2.

Dielectric materials can be disposed within the space between the bus hb1 and the buses vb1 and vb2. Dielectric materials can be disposed within the space between the bus hb1 and the fingers vf1-vf6. The dielectric layer 22 surrounds the buses vb1 and vb2 and the fingers vf1-vf6. The dielectric layer 22 covers the buses vb1 and vb2 and the fingers vf1-vf6. The buses vb1 and vb2 and the fingers vf1-vf6 are embedded within the dielectric layer 22. The dielectric layer 22 can include, for example, silicon dioxide, glass, PTFE (Teflon), polyethylene (PE), polyimide, polypropylene, polystyrene, titanium dioxide, strontium titanate, barium strontium titanate, barium titanate, conjugated polymers, calcium copper titanate, or other applicable materials. In some embodiments, the dielectric layer 22 can be replaced by vacuum.

The buses hb1, vb1 and vb2 and the fingers vf1-vf6 can be formed at two arbitrary adjacent conductive layers within a semiconductor device. In some embodiments, the buses hb1, vb1 and vb2 and the fingers vf1-vf6 can be formed at first and second metal layers, also referred to as metal layers M0 and M1 in some embodiments. In some embodiments, the buses hb1, vb1 and vb2 and the fingers vf1-vf6 can be formed at second and third metal layers, also referred to as metal layers M1 and M2 in some embodiments. In some embodiments, the buses hb1, vb1 and vb2 and the fingers vf1-vf6 can be formed at third and fourth metal layers, also referred to as metal layers M2 and M3 in some embodiments. In some embodiments, the buses hb1, vb1 and vb2 and the fingers vf1-vf6 can be formed at fourth and fifth metal layers, also referred to as metal layers M3 and M4 in some embodiments. In some embodiments, the buses hb1, vb1 and vb2 and the fingers vf1-vf6 can be formed at two adjacent metal layers higher than the fifth metal layer.

Cell 20 including electrodes 20a and 20b is thereby configured to enable a multi-cell capacitive device to include cells that are directly abutted by sharing first and/or second buses, e.g., through adjacent cells having a mirror symmetry. Compared to approaches that do not include an electrode, e.g., electrode 20a or 20b, configured to enable directly abutted cells, the capacitive device is capable of having an increased density, thereby improving performance for a given area.

In some embodiments, cell 20 (and/or a cell 30, 40, or 50 discussed below) includes buses hb1, hb2, vb1, and vb2, and fingers hf1-hf6 and vf1-vf6 having one or more of the dimensions discussed above configured to avoid violations of one or more design rules of a manufacturing process used to create cell 20 and is thereby capable of being directly abutted with additional instances of cell 20 as discussed below. For example, in some embodiments, the dimensions correspond to buses vb1 and vb2 having a spacing matched to a pitch of a metal layer below that of buses hb1 and hb2 such that a metal/via overlap violation is avoided.

Figure 2E:
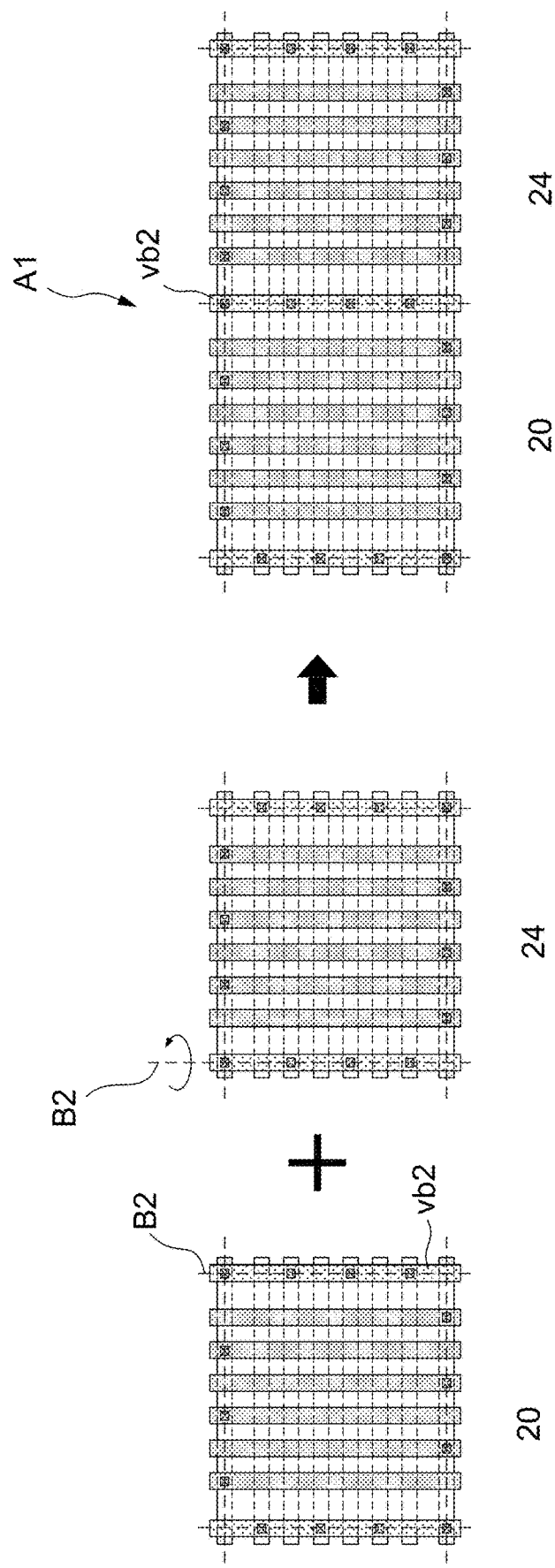
FIG. 2E illustrates an exemplary arrangement of one cell abutting another cell, in accordance with some embodiments.

FIG. 2E illustrates an exemplary arrangement of one cell abutting another cell, in accordance with some embodiments. Referring to FIG. 2E, a cell array A1 can be obtained by abutting the cell 20 and the cell 24. The cells 20 and 24 are symmetrical with respect to the boundary B2 or the bus vb2. In some embodiments, the cell 24 can be obtained by flipping the cell 20 along the boundary B2 (or the bus vb2) by 180°. For the cell array A1, the bus vb2 will be shared by both the cells 20 and 24. That is, the bus vb2 can be a part of the cell 20 and also a part of the cell 24. The cell array A1 will have a capacitance substantially equal to the sum of the capacitances of the cells 20 and 24.

By aligning the buses of a MOM cell with the cell boundaries, as the cells 20 and 24 do, a cell array (e.g., the cell array A1) with a higher area efficiency is therefore made possible. By abutting a MOM cell with its mirror symmetric cell (e.g., cells 20 and 24), a cell array (e.g., the cell array A1) with a higher area efficiency is therefore created. Specifically, a cell array with higher capacitance can be obtained by abutting several MOM cells, without space therebetween, while space between MOM cells is usually required in common technique.

Figure 2F:
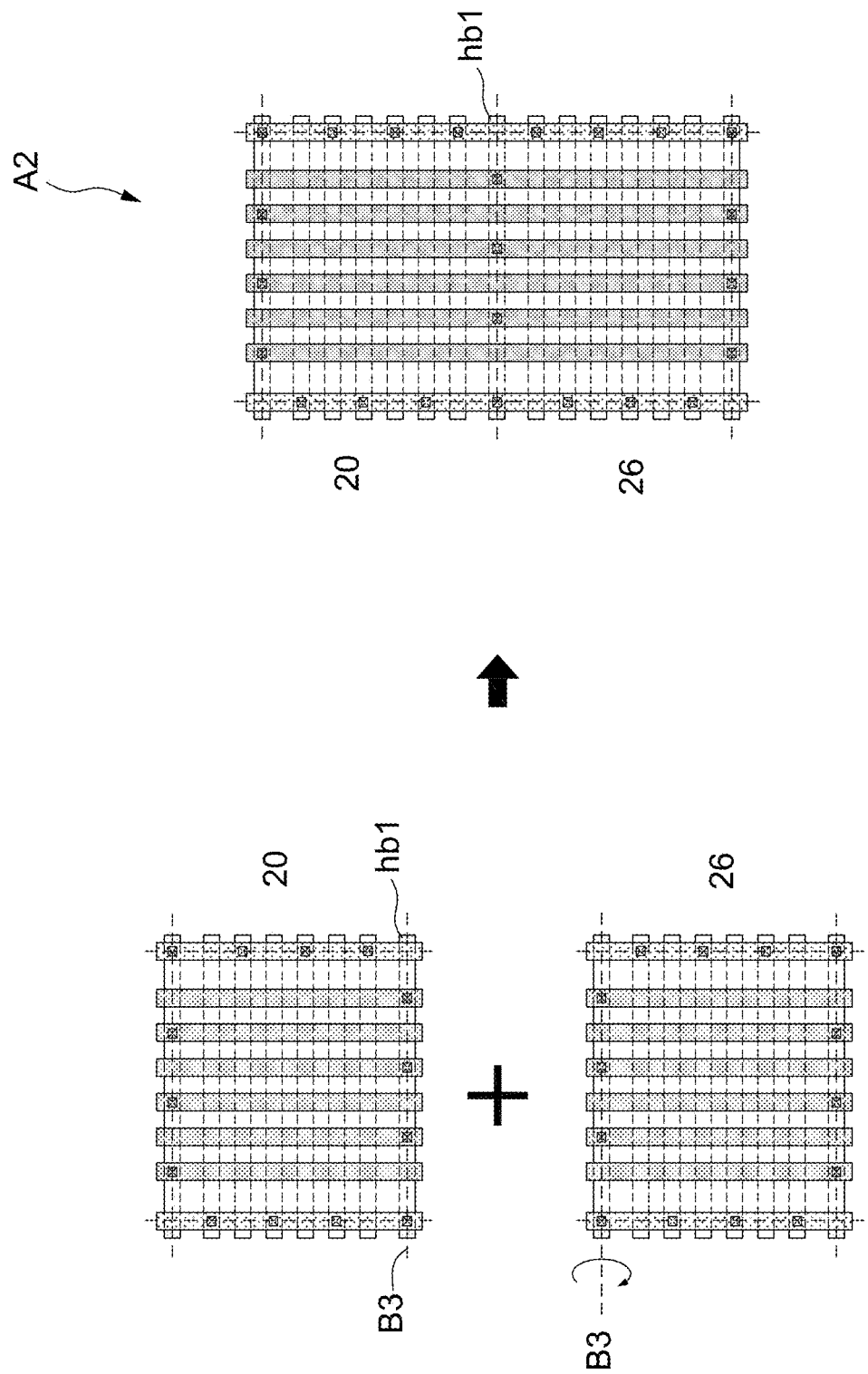
FIG. 2F illustrates an exemplary arrangement of one cell abutting another cell, in accordance with some embodiments.

FIG. 2F illustrates an exemplary arrangement of one cell abutting another cell, in accordance with some embodiments. Referring to FIG. 2F, a cell array A2 can be obtained by abutting the cell 20 and the cell 26. The cells 20 and 26 are mirror symmetric with respect to the boundary B3 or the bus hb1. In some embodiments, the cell 26 can be obtained by flipping the cell 20 along the boundary B3 (or the bus hb1) by 180°. For the cell array A2, the bus hb1 will be shared by both the cells 20 and 26. That is, the bus hb1 can be a part of the cell 20 and also a part of the cell 26. The cell array A2 will have a capacitance substantially equal to the sum of the capacitances of the cells 20 and 26.

By aligning the buses of a MOM cell with the cell boundaries, as the cells 20 and 26 do, a cell array (e.g., the cell array A2) with a higher area efficiency is therefore made possible. By abutting a MOM cell with its mirror symmetric cell (e.g., cells 20 and 26), a cell array (e.g., the cell array A2) with a higher area efficiency is therefore created. Specifically, a cell array with higher capacitance can be obtained by abutting several MOM cells, without space therebetween, while space between MOM cells is usually required in common technique.

Figure 2G:
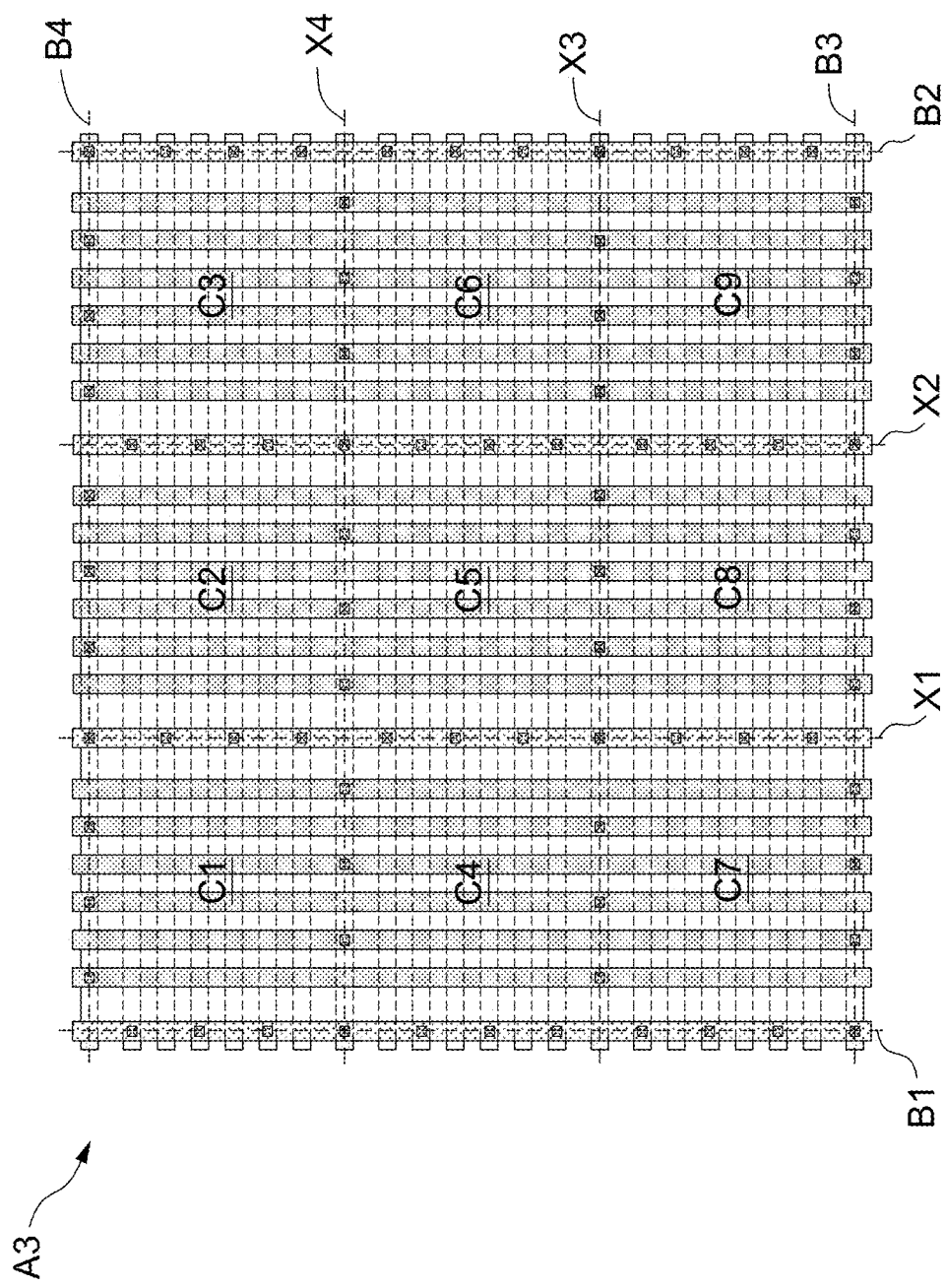
FIG. 2G illustrates a cell array in accordance with some embodiments.

FIG. 2G illustrates a cell array in accordance with some embodiments. FIG. 2G shows a cell array A3 comprising cells C1, C2, C3, C4, C5, C6, C7, C8, and C9. For the cell array A3, buses are arranged along the cell boundaries B1, B2, B3, and B4, and the axes X1, X2, X3, and X4. The cell C1 of FIG. 2G can be the cell 20 of FIG. 2A. In the cell array A3, one cell is mirror symmetric to its adjacent cell. For example, the cell C1 is mirror symmetric to the cell C2 with respect to the axis X1. Similarly, the cell C2 is mirror symmetric to the cell C3 with respect to the axis X2. The cell C4 is mirror symmetric to the cell C5 with respect to the axis X1, and the cell C5 is mirror symmetric to the cell C6 with respect to the axis X2. The cell C7 is mirror symmetric to the cell C8 with respect to the axis X1, and the cell C8 is mirror symmetric to the cell C9 with respect to the axis X2.

In addition, the cell C1 is mirror symmetric to the cell C4 with respect to the axis X4, and the cell C4 is mirror symmetric to the cell C7 with respect to the axis X3. The cell C2 is mirror symmetric to the cell C5 with respect to the axis X4, and the cell C5 is mirror symmetric to the cell C8 with respect to the axis X3. The cell C3 is mirror symmetric to the cell C6 with respect to the axis X4, and the cell C6 is mirror symmetric to the cell C9 with respect to the axis X3.

By abutting a MOM cell with its mirror symmetric cell, a cell array (e.g., the cell array A3) with a higher area efficiency is therefore created. The cell array A3 will have a capacitance substantially equal to the sum of the capacitances of the cells C1-C9.

Figure 2H:
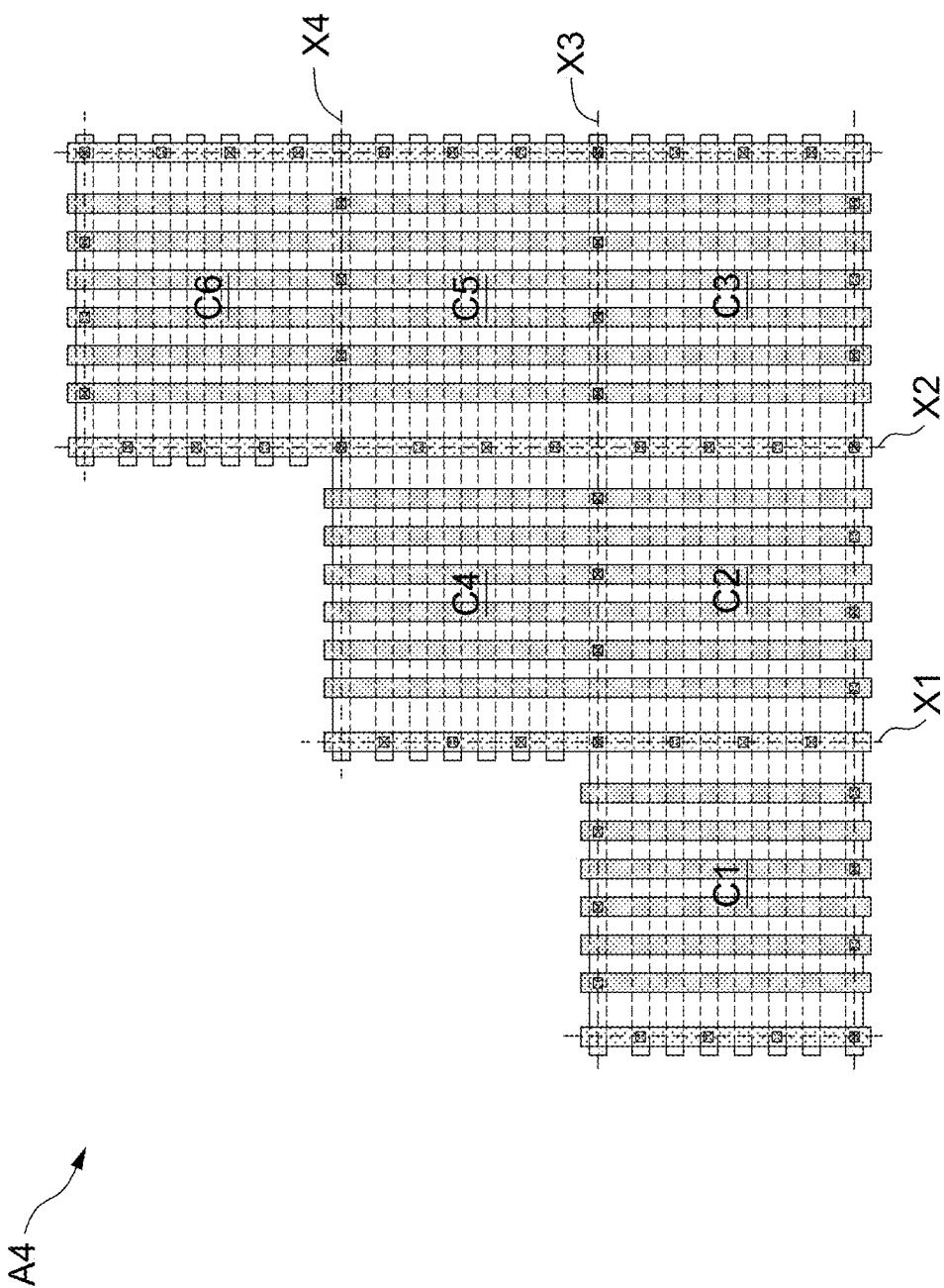
FIG. 2H illustrates a cell structure in accordance with some embodiments.

FIG. 2H illustrates a cell structure in accordance with some embodiments. FIG. 2H shows a cell structure A4 comprising cells C1, C2, C3, C4, C5, and C6. As shown in FIG. 2H, the cells C1, C2, C3, C4, C5, and C6 of the cell structure A4 are not arranged as a regular array. The irregular arrangement of the cells C1, C2, C3, C4, C5, and C6 could achieve good area utilization for the cell structure A4 to be applied as a decoupling capacitor (DECAP).

The cell C1 of FIG. 2H can be the cell 20 of FIG. 2A. In the cell structure A4, one cell is mirror symmetric to its adjacent cell. The cell C1 is mirror symmetric to the cell C2 with respect to the axis X1, and the cell C2 is mirror symmetric to the cell C3 with respect to the axis X2. The cell C4 is mirror symmetric to the cell C5 with respect to the axis X2. The cell C6 is mirror symmetric to the cell C5 with respect to the axis X4, and the cell C5 is mirror symmetric to the cell C3 with respect to the axis X3. The cell C4 is mirror symmetric to the cell C2 with respect to the axis X3.

Figure 3A:
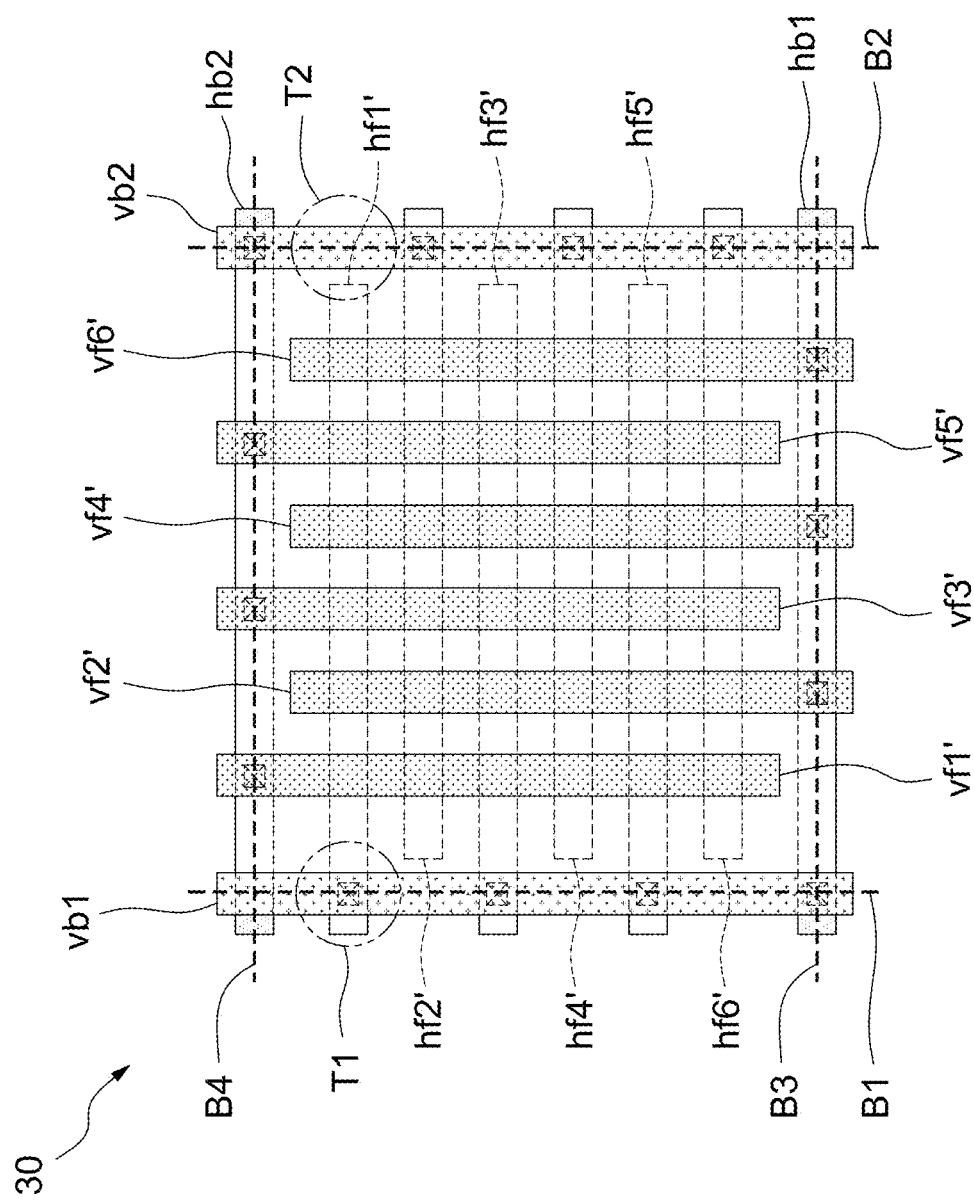
FIG. 3A illustrates a single cell in accordance with some embodiments.

FIG. 3A illustrates a single cell in accordance with some embodiments. FIG. 3A shows a cell 30 that may be stored in the cell libraries 206. The cell 30 is a MOM capacitor cell. The cell 30 is arranged within cell boundaries B1, B2, B3, and B4. The cell 30 is similar to the cell 20 of FIG. 2A, the difference therebetween is that in the cell 30, the fingers are not identical in length to the buses. Referring to FIG. 3A, the fingers hf1', hf2', hf3', hf4', hf5', and hf6' are shorter than the buses hb1 and hb2. The fingers vf1', vf2', vf3', vf4', vf5', and vf6' are shorter than the buses vb1 and vb2.

For the fingers of the cell 30, one end thereof overlaps a portion of a bus from the top view perspective, and the other end thereof is spaced apart from another bus. For example, take the finger hf1' as an example, one end of the finger hf1' overlaps a portion of the bus vb1 (see, for example, the dotted circle T1), while the other end of the finger hf1' is spaced apart from the bus vb2 (see, for example, the dotted circle T2). The space between a finger and a bus can prevent an undesired short circuit resulting from electromigration.

For example, as will be discussed in the subsequent paragraphs, the finger hf1' is electrically connected to a reference voltage through the bus vb1, which receives a reference voltage, while the bus vb2 is configured to receive a different reference voltage. The space between the finger hf1' and the bus vb2 can prevent an undesired short circuit therebetween. Also, the space between a finger and a bus can increase the breakdown voltage that can be sustained by the cell 30, and thus improve the max voltage tolerance of a semiconductor device that including the cell 30.

Figure 3B:
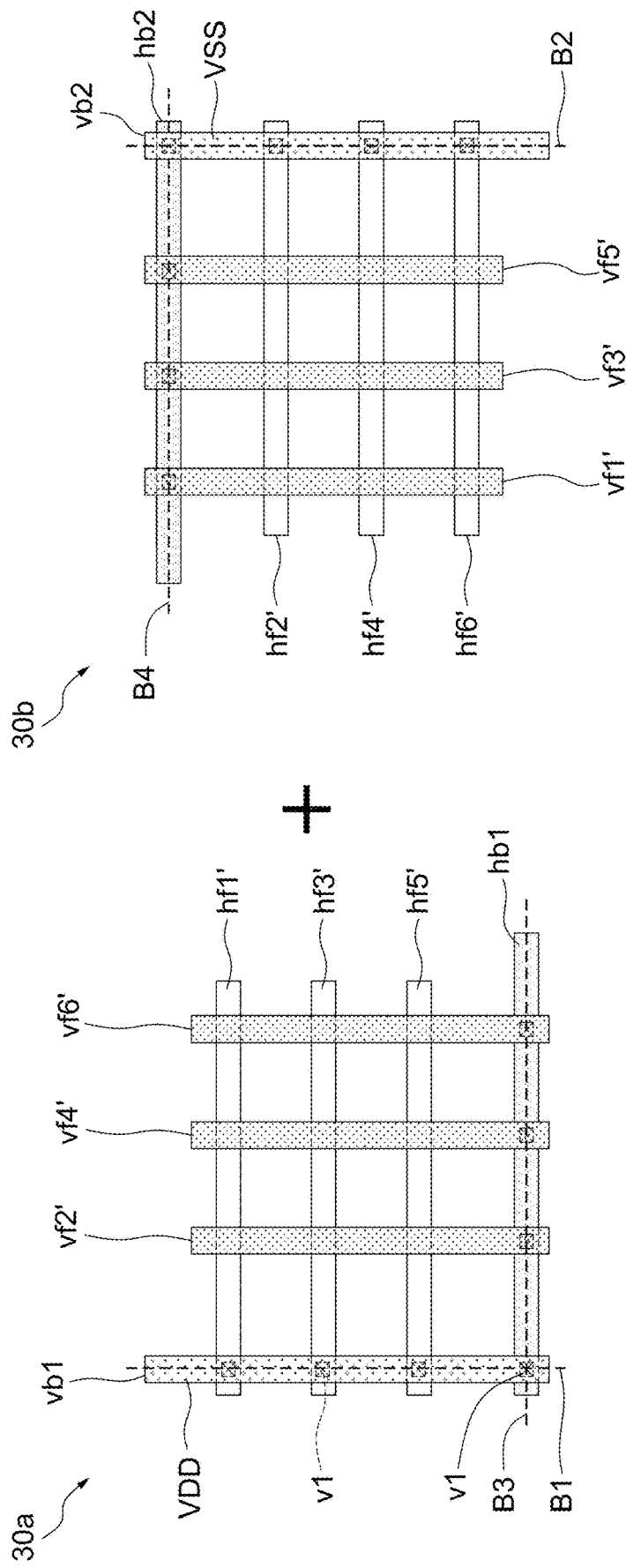
FIG. 3B illustrates an exemplary decomposition of a single cell, in accordance with some embodiments.

FIG. 3B illustrates an exemplary decomposition of a single cell, in accordance with some embodiments. FIG. 3B shows an exemplary decomposition of the cell 30. The cell 30 can include the conductive structures 30a and 30b. In some embodiments, the conductive structures 30a and 30b can each be referred to as an electrode or a plate. In some embodiments, the conductive structures 30a and 30b can each be referred to as a mesh electrode or a mesh plate.

The conductive structure 30a includes fingers at different elevations. The conductive structure 30a includes buses at different elevations. The bus hb1 and the fingers hf1', hf3', and hf5' are located at the same elevation. The bus vb1 and the fingers vf2', vf4', and vf6' are located at the same elevation. The fingers vf2', vf4', and vf6' and the bus vb1 are disposed above the fingers hf1', hf3', and hf5' and the bus hb1.

The bus vb1 can be electrically connected to the fingers hf1', hf3', and hf5' through conductive vias (e.g., v1). The bus vb1 can be electrically connected to the bus hb1 through a conductive via (e.g., v1). The bus hb1 can be electrically connected to the fingers vf2', vf4', and vf6' through conductive vias (e.g., v1). The bus hb1 can be electrically connected to the bus vb1 through a conductive via (e.g., v1). The bus vb1 is aligned with the cell boundary B1. The bus hb1 is aligned with the cell boundary B3.

The conductive structure 30a is configured to receive a reference voltage. In some embodiments, the conductive structure 30a can be configured to receive a reference voltage VDD. The reference voltage VDD can be applied to the conductive structure 30a through the bus vb1 or the bus hb1. All the fingers of the conductive structure 30a will be configured at a substantial identical electric potential.

The conductive structure 30b includes fingers at different elevations. The conductive structure 30b includes buses at different elevations. The bus hb2 and the fingers hf2', hf4', and hf6' are located at the same elevation. The bus vb2 and the fingers vf1', vf3', and vf5' are located at the same elevation. The fingers vf1', vf3', and vf5' and the bus vb2 are disposed above the fingers hf2', hf4', and hf6' and the bus hb2.

The bus vb2 can be electrically connected to the fingers hf2', hf4', and hf6' through conductive vias (e.g., v1). The bus vb2 can be electrically connected to the bus hb2 through a conductive via (e.g., v1). The bus hb2 can be electrically connected to the fingers vf1', vf3', and vf5' through conductive vias (e.g., v1). The bus hb2 can be electrically connected to the bus vb2 through a conductive via (e.g., v1). The bus vb2 is aligned with the cell boundary B2. The bus hb2 is aligned with the cell boundary B4.

The conductive structure 30b is configured to receive a reference voltage. In some embodiments, the conductive structure 30b can be configured to receive a reference voltage VSS. The reference voltage VSS can be applied to the conductive structure 30b through the bus vb2 or the bus hb2. All the fingers of the conductive structure 30b will be configured at a substantially identical electric potential.

Cell 30 including electrodes 30a and 30b is thereby configured to enable a multi-cell capacitive device to include cells that are directly abutted by sharing first and/or second buses, whereby the benefits discussed above with respect to cell 20 are capable of being achieved.

Figure 3C:
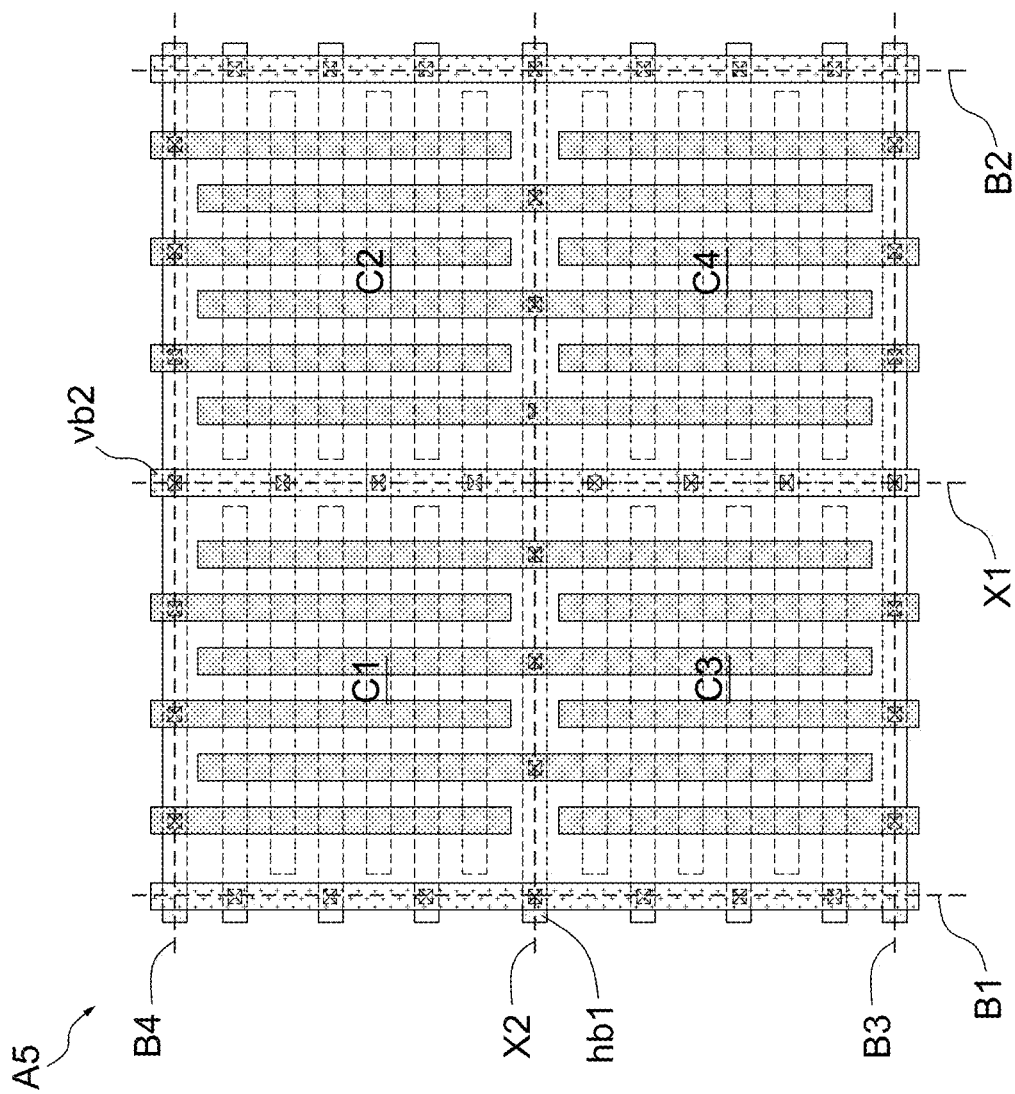
FIG. 3C illustrates a cell array in accordance with some embodiments.

FIG. 3C illustrates a cell array A5 in accordance with some embodiments, comprising cells C1, C2, C3, and C4. For the cell array A5, buses are arranged along the cell boundaries B1, B2, B3, and B4, and the axes X1 and X2. The cell C1 of FIG. 3C can be the cell 30 of FIG. 3A. In the cell array A5, one cell is mirror symmetric to its adjacent cell. For example, the cell C1 is mirror symmetric to the cell C2 with respect to the axis X1. Similarly, the cell C2 is mirror symmetric to the cell C4 with respect to the axis X2. The cell C3 is mirror symmetric to the cell C4 with respect to the axis X1, and the cell C3 is mirror symmetric to the cell C1 with respect to the axis X2.

The bus vb2 is shared by the cells C1 and C2. That is, the bus vb2 is a part of the cell C1 and also a part of the cell C2. The bus vb2 is shared by the cells C3 and C4. That is, the bus vb2 is a part of the cell C3 and also a part of the cell C4. The bus hb1 is shared by the cells C1 and C3. That is, the bus hb1 is a part of the cell C1 and also a part of the cell C3. The bus hb1 is shared by the cells C2 and C4. That is, the bus hb1 is a part of the cell C2 and also a part of the cell C4.

By abutting a MOM cell with its mirror symmetric cell, a cell array (e.g., the cell array A5) with a higher area efficiency is therefore created. The cell array A5 will have a capacitance substantially equal to the sum of the capacitances of the cells C1-C4.

FIG. 4A illustrates a single cell 40 in accordance with some embodiments that may be stored in the cell libraries 206. The cell 40 is a MOM capacitor cell. The cell 40 is arranged within cell boundaries B1, B2, B3, and B4. The cell 40 is similar to the cell 20 of FIG. 2A, the difference therebetween is that in the cell 40, the buses are not aligned with the cell boundaries. That is, the buses of the cell 40 are adjacent to the cell boundaries. The buses of the cell 40 are spaced apart from the cell boundaries. The buses of the cell 40 are disposed around the cell boundaries.

FIG. 4B illustrates an exemplary decomposition of a single cell, in accordance with some embodiments.

FIG. 4B shows an exemplary decomposition of the cell 40. The cell 40 can include the conductive structures 40a and 40b. In some embodiments, the conductive structures 40a and 40b can each be referred to as an electrode or a plate. In some embodiments, the conductive structures 40a and 40b can each be referred to as a mesh electrode or a mesh plate.

The conductive structure 40a is similar to the conductive structure 20a of FIG. 2B, the difference therebetween is that in the conductive structure 40a, the buses vb1 and hb1 are not aligned with the cell boundaries B1 and B3. The conductive structure 40b is similar to the conductive structure 20b of FIG. 2B, the difference therebetween is that in the conductive structure 40b, the buses vb2 and hb2 are not aligned with the cell boundaries B2 and B4.

Cell 40 including electrodes 40a and 40b is thereby configured to enable a multi-cell capacitive device to include cells that are closely abutted by having reduced spacing between electrode components compared to other approaches, whereby the benefits discussed above with respect to cell 20 are capable of being achieved.

In some embodiments, cell 40 includes buses vb1, vb2, hb1, and hb2, offset from corresponding boundaries B1-B4 by one or more distances configured to avoid violations of one or more design rules of a manufacturing process used to create cell 40 and is thereby capable of being directly abutted with additional instances of cell 40, e.g., by avoiding having abutted cells cause violations of one or more of a metal-to-metal, metal-to-via, or via-to-via spacing rule.

FIG. 4C illustrates a cell array in accordance with some embodiments. FIG. 4C shows a cell array A6 comprising cells C1, C2, C3, and C4. The cell C1 of FIG. 4C can be the cell 40 of FIG. 4A. In the cell array A6, one cell is mirror symmetric to its adjacent cell. For example, the cell C1 is mirror symmetric to the cell C2 with respect to the axis X1. Similarly, the cell C2 is mirror symmetric to the cell C4 with respect to the axis X2. The cell C3 is mirror symmetric to the cell C4 with respect to the axis X1, and the cell C3 is mirror symmetric to the cell C1 with respect to the axis X2. The buses vb2 and vb3 are disposed on opposite sides of the axis X1. The buses vb2 and vb3 sandwich the axis X1. The buses hb2 and hb3 are disposed on opposite sides of the axis X2. The buses hb2 and hb3 sandwich the axis X2.

By abutting a MOM cell with its mirror symmetric cell, a cell array (e.g., the cell array A6) with a higher area efficiency is therefore created. The cell array A6 will have a capacitance substantially equal to the sum of the capacitances of the cells C1-C4.

FIG. 5A illustrates a single cell in accordance with some embodiments. FIG. 5A shows a cell 50 that may be stored in the cell libraries 206. The cell 50 is a MOM capacitor cell. The cell 50 is arranged within cell boundaries B1, B2, B3, and B4. The cell 50 is similar to the cell 20 of FIG. 2A, the difference therebetween is that the cell 50 includes additional vertical buses (i.e., the buses vb3 and vb4). In addition, the cell 50 includes additional conductive vias for connecting the additional vertical buses to their corresponding fingers. For example, the bus vb3 is electrically connecting to its corresponding fingers through the conductive via v2. Although the cell 50 as shown includes only two horizontal buses (i.e., the buses hb1 and hb2), it can be contemplated that the cell 50 may include additional horizontal buses to suit needs.

With additional buses, the overall resistance of the cell 50 can be reduced accordingly. The relatively lower resistance of a MOM capacitor can decrease the latency of a semiconductor. The relatively lower resistance of a MOM capacitor can increase the response speed of a semiconductor. The relatively lower resistance of a MOM capacitor can also increase the bandwidth of a semiconductor.

The width Wb of a bus can be different than the width Wf of a finger. In some embodiments, the width Wb of a bus can equal or exceed the width Wf of a finger. A bus of greater width can facilitate reducing overall bus metal resistance in the semiconductor device manufactured.

The distance Dbb between adjacent buses can be different than the distance Dff between adjacent fingers. In some embodiments, the distance Dbb between adjacent buses can equal or exceed the distance Dff between adjacent fingers. The "VIA to VIA" space (e.g., the space between vias v1 and v2) is usually taken into consideration in fabrication of a semiconductor device. Neighboring vias may have a possibility of bridging. In the implementation, a greater space between adjacent buses is sometimes preferred in order to avoid any uncertainty in fabrication.

FIG. 5B shows an exemplary decomposition of the cell 50. The cell 50 can include the conductive structures 50a and 50b. In some embodiments, the conductive structures 50a and 50b can each be referred to as an electrode or a plate. In some embodiments, the conductive structures 50a and 50b can each be referred to as a mesh electrode or a mesh plate.

The conductive structure 50a is similar to the conductive structure 20a of FIG. 2B, the difference therebetween is that the conductive structure 50a includes an additional bus vb3. The bus vb3 is electrically connected to the fingers hf1, hf3, and hf5 through conductive vias v2. The bus vb3 is electrically connected to the bus hb1 through a conductive via v2. The conductive structure 50a is configured to receive a reference voltage VDD.

The conductive structure 50b is similar to the conductive structure 20b of FIG. 2B, the difference therebetween is that the conductive structure 50b includes an additional bus vb4. The bus vb4 is electrically connected to the fingers hf2, hf4, and hf6 through conductive vias v2. The bus vb4 is electrically connected to the bus hb2 through a conductive via v2. The conductive structure 50b is configured to receive a reference voltage VSS.

Cell 50 including electrodes 50a and 50b is thereby configured to enable a multi-cell capacitive device to include cells that are directly abutted by sharing first and/or second buses, whereby the benefits discussed above with respect to cell 20 are capable of being achieved.

FIG. 5C illustrates a cell array in accordance with some embodiments. FIG. 5C shows a cell array A7 comprising cells C1, C2, C3, and C4. The cell C1 of FIG. 5C can be the cell 50 of FIG. 5A. In the cell array A7, one cell is mirror symmetric to its adjacent cell. For example, the cell C1 is mirror symmetric to the cell C2 with respect to the axis X1. Similarly, the cell C2 is mirror symmetric to the cell C4 with respect to the axis X2. The cell C3 is mirror symmetric to the cell C4 with respect to the axis X1, and the cell C3 is mirror symmetric to the cell C1 with respect to the axis X2. The bus vb2 is aligned with the axis X1. The buses vb4 and vb5 are disposed on opposite sides of the axis X1. The buses vb4 and vb5 sandwich the axis X1.

The bus vb2 is shared by the cells C1 and C2. That is, the bus vb2 is a part of the cell C1 and also a part of the cell C2. The bus vb2 is shared by the cells C3 and C4. That is, the bus vb2 is a part of the cell C3 and also a part of the cell C4. The bus hb1 is shared by the cells C1 and C3. That is, the bus hb1 is a part of the cell C1 and also a part of the cell C3. The bus hb1 is shared by the cells C2 and C4. That is, the bus hb1 is a part of the cell C2 and also a part of the cell C4.

By abutting a MOM cell with its mirror symmetric cell, a cell array (e.g., the cell array A7) with a higher area efficiency is therefore created. The cell array A7 will have a capacitance substantially equal to the sum of the capacitances of the cells C1-C4. With additional buses, the overall resistance of the cell array A7 can be reduced accordingly. The relatively lower resistance of a capacitor cell array can decrease the latency of a semiconductor. The relatively lower resistance of a capacitor cell array can increase the response speed of a semiconductor. The relatively lower resistance of a capacitor cell array can also increase the bandwidth of a semiconductor.

FIG. 6 is a flowchart showing a method 600 of arranging metal-oxide-metal (MOM) cells within a semiconductor device layout, in accordance with some embodiments of the present disclosure. FIG. 6 is a flowchart of method 600 including operations 602, 604, 606, 608, and 610, operable to generate a semiconductor device layout corresponding to one or more of cells 20-50 or arrays A1-A7 discussed above with respect to FIGS. 2A-5C.

In some embodiments, some or all of the operations of method 600 is executed by a processor of a computer, e.g., CPU 120, discussed above with respect to FIG. 1A.

Some or all of the operations of method 600 are capable of being performed as part of a design procedure performed in a design house, e.g., a design house 820 discussed below with respect to FIG. 8.

In some embodiments, the operations of method 600 are performed in the order depicted in FIG. 6. In some embodiments, the operations of method 600 are performed simultaneously and/or in an order other than the order depicted in FIG. 6. In some embodiments, one or more operations are performed before, between, during, and/or after performing one or more operations of method 600.

In the operation 602, a first metal-oxide-metal (MOM) cell is placed within a layout of a semiconductor. The first MOM cell includes a first bus and a second bus extending along a first direction and a third bus and a fourth bus extending along a second direction. The first MOM cell can be, for example, the cells 20, 30, 40, or 50 disclosed in the present disclosure. The operation 602 can be performed collaboratively, for example, by the synthesis 205, the cell libraries 206, and the place and route 213 of FIG. 1B.

In operation 604, a second MOM cell is formed by flipping the first MOM cell along the second bus. For example, referring back to FIG. 2E, the cell 24 can be formed by flipping the cell 20 along the bus vb2 by 180°. In operation 604, the second MOM cell formed is mirror symmetric to the first MOM cell with respect to the second bus. The operation 604 can be performed collaboratively, for example, by the synthesis 205, the cell libraries 206, and the place and route 213 of FIG. 1B.

In operation 606, the second MOM cell is placed abutting to the first MOM cell. For example, referring back to FIG. 2G, 2H, 3C, 4C, or 5C, the cell C2 can be placed abutting the cell C1. The operation 606 can be performed collaboratively, for example, by the synthesis 205, the cell libraries 206, and the place and route 213 of FIG. 1B.

In operation 608, a third MOM cell is formed by flipping the first MOM cell along the third bus. For example, referring back to FIG. 2F, the cell 26 can be formed by flipping the cell 20 along the bus hb1 by 180°. In operation 608, the third MOM cell formed is mirror symmetric to the first MOM cell with respect to the third bus. The operation 608 can be performed collaboratively, for example, by the synthesis 205, the cell libraries 206, and the place and route 213 of FIG. 1B.

In operation 610, the third MOM cell is placed abutting the first MOM cell. For example, referring back to FIG. 3C, 4C, or 5C, the cell C3 can be placed abutting the cell C1. The operation 610 can be performed collaboratively, for example, by the synthesis 205, the cell libraries 206, and the place and route 213 of FIG. 1B.

By executing some or all of the operations of method 600, a semiconductor device layout diagram is generated corresponding to a semiconductor device that includes some or all of the features discussed above with respect to cells 20-50 and arrays A1-A7, thereby obtaining the benefits discussed above.

FIG. 7 is a flowchart of a method 700 of manufacturing a semiconductor device, in accordance with some embodiments. Method 700 is operable to form one or more of cells 20-50 or arrays A1-A7 discussed above with respect to FIGS. 2A-5C.

In some embodiments, the operations of method 700 are performed in the order depicted in FIG. 7. In some embodiments, the operations of method 700 are performed in an order other than the order depicted in FIG. 7 and/or two or more operations of method 700 are performed simultaneously. In some embodiments, one or more additional operations are performed before, during, and/or after the operations of method 700. In some embodiments, performing some or all of the operations of method 700 includes performing one or more operations as discussed below with respect to IC manufacturing system 800 of FIG. 8.

At operation 710, in some embodiments, front-end-of-line (FEOL) devices are formed in a semiconductor substrate. In various embodiments, forming FEOL devices includes forming one or more transistors, e.g., included in one or more logical or functional circuits. In some embodiments, forming FEOL devices includes forming one or more active areas, source/drain (S/D) structures, isolation structures, gate structures, or the like.

In some embodiments, forming FEOL devices includes performing one or more implantation processes in areas of a semiconductor substrate corresponding to active areas, whereby predetermined doping concentrations and types are achieved for one or more given dopants. In some embodiments, forming FEOL devices includes performing one or more lithography, deposition, etching, planarizing, or other suitable processes.

At operation 720, first and second buses and first and second groups of fingers extending in a first direction at a first elevation are constructed. Constructing the first and second buses and first and second groups of fingers includes constructing the first and second groups of fingers between the first and second buses at the first elevation, also referred to as a first metal layer in some embodiments.

In some embodiments, constructing the first and second groups of fingers includes alternating the fingers of the first group of fingers with the fingers of the second group of fingers.

In some embodiments, constructing the first and second buses and first and second groups of fingers includes constructing conductive segments corresponding to buses hb1 and hb2, odd numbered instances of fingers hfx, and even numbered instances of fingers hfx, respectively, as discussed above with respect to cells 20-50 and FIGS. 2A-5C.

In some embodiments, constructing the first and second buses and first and second groups of fingers includes constructing conductive segments corresponding to multiple cells of an array, e.g., one or more of arrays A1-A7 discussed above with respect to FIGS. 2A-5C.

In some embodiments, constructing conductive segments, e.g., one or more of a bus, group of fingers, via or other electrical connection discussed herein with respect to operations 720-740, includes performing a plurality of manufacturing operations including depositing and patterning one or more photoresist layers, performing one or more etching processes, and performing one or more deposition processes whereby one or more conductive materials are configured to form a continuous, low resistance structure.

At operation 730, third and fourth buses and third and fourth groups of fingers extending in a second direction at a second elevation are constructed. Constructing the third bus and third group of fingers includes constructing vias whereby the third bus and third group of fingers are electrically connected to the first bus and the first group of fingers, and the fourth bus and fourth group of fingers are electrically connected to the second bus and second group of fingers. Constructing the third and fourth buses and third and fourth groups of fingers includes constructing the third and fourth groups of fingers between the third and fourth buses at the second elevation, also referred to as a second metal layer in some embodiments.

In some embodiments, constructing the third and fourth groups of fingers includes alternating the fingers of the third group of fingers with the fingers of the fourth group of fingers.

In some embodiments, constructing the third and fourth buses and third and fourth groups of fingers includes constructing conductive segments corresponding to buses vb1 and vb2, even numbered instances of fingers vfx, and odd numbered instances of fingers vfx, respectively, as discussed above with respect to cells 20-50 and FIGS. 2A-5C.

In some embodiments, constructing the third and fourth buses and third and fourth groups of fingers includes constructing conductive segments corresponding to multiple cells of an array, e.g., one or more of arrays A1-A7 discussed above with respect to FIGS. 2A-5C.

At operation 740, in some embodiments, a first electrical connection is constructed between a first reference voltage path and the first and third busses and first and third groups of fingers, and a second electrical connection is constructed between a second reference voltage path and the second and fourth busses and second and fourth groups of fingers.

In some embodiments, constructing the electrical connection includes constructing one or more conductive segments at one or more of the first, second, or another elevations and/or constructing one or more vias between various elevations.

In various embodiments, constructing the electrical connection includes constructing one or more electrical connections between one or more reference voltage paths configured to carry one or both of voltages VDD or VSS as discussed above with respect to FIGS. 2A-5C.

By executing some or all of the operations of method 700, a semiconductor device is built that includes some or all of the features discussed above with respect to cells 20-50 and arrays A1-A7, thereby obtaining the benefits discussed above.

FIG. 8 is a block diagram of IC manufacturing system 800, and an IC manufacturing flow associated therewith, in accordance with some embodiments. In some embodiments, based on an IC layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns, e.g., an IC layout diagram including the MOM cells discussed above. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file (RDF). Mask data preparation 832 provides the RDF to mask fabrication 844. Mask fabrication 844 includes a mask writer. A mask writer converts the RDF to an image on a substrate, such as mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) or EUV beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 is an IC fabrication facility that includes one or more manufacturing facilities for the fabrication of a variety of different IC products. In some embodiments, IC Fab 850 is a semiconductor foundry. For example, there may be a manufacturing facility for the front-end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry.

IC fab 850 includes wafer fabrication tools 852 configured to execute various manufacturing operations on semiconductor wafer 853 such that IC device 860 is fabricated in accordance with the mask(s), e.g., mask 845. In various embodiments, fabrication tools 852 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

According to some embodiments, a semiconductor device is provided. The semiconductor device includes a first metal-oxide-metal (MOM) cell. The first MOM cell comprises a first bus in a first elevation and extending along a first direction; and a second bus in a second elevation, extending along a second direction different than the first direction, and electrically connected to the first bus through a via. The first MOM cell further comprises a first group of fingers in the first elevation and extending along the first direction; and a second groups of fingers in the second elevation and extending along the second direction. Each finger of the first group of fingers is electrically connected to the second bus through a corresponding via, each finger of the second group of fingers is electrically connected to the first bus through a corresponding via, and each finger of the first group of fingers overlaps each finger of the second group of fingers.

According to other embodiments, a semiconductor device is provided. The semiconductor device includes a first metal-oxide-metal (MOM) cell. The first MOM cell comprises a first bus and a second bus at a first elevation and extending along a first direction, and a third bus and a fourth bus at a second elevation and extending along a second direction different from the first direction. The first MOM cell further comprises a first group of fingers alternating with a second group of fingers at the first elevation and extending along the first direction, all of which are disposed between the first bus and the second bus, and a third group of fingers alternating with a fourth group of fingers at the second elevation and extending along the second direction, all of which are disposed between the third bus and the fourth bus. The first bus and the third bus are electrically connected through a via, the second bus and the fourth bus are electrically connected through a via, each finger of the first group of fingers is electrically connected to the third bus through a corresponding via, each finger of the second group of fingers is electrically connected to the fourth bus through a corresponding via, each finger of the third group of fingers is electrically connected to the first bus through a corresponding via, and each finger of the fourth group of fingers is electrically connected to the second bus through a corresponding via.

According to other embodiments, a method of manufacturing a semiconductor device is provided. The method includes constructing first and second buses and first and second groups of fingers extending in a first direction at a first elevation, the first and second groups of fingers being between the first and second buses, and constructing third and fourth buses and third and fourth groups of fingers extending in a second direction at a second elevation, the third and fourth groups of fingers being between the third and fourth buses. The third bus and third group of fingers are electrically connected through vias to the first bus and first group of fingers, and the fourth bus and fourth group of fingers are electrically connected through vias to the second bus and second group of fingers.

The methods and features of the present disclosure have been sufficiently described in the above examples and descriptions. It should be understood that any modifications or changes without departing from the spirit of the present disclosure are intended to be covered in the protection scope of the present disclosure.

Moreover, the scope of the present application in not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, may be utilized according to the present disclosure.

Accordingly, the appended claims are intended to include within their scope: processes, machines, manufacture, compositions of matter, means, methods or steps. In addition, each claim constitutes a separate embodiment, and the combination of various claims and embodiments are within the scope of the present disclosure.

What is claimed is:

1. A semiconductor device, comprising:
   a first metal-oxide-metal (MOM) cell, comprising:
   a first bus at a first elevation and extending along a first direction;
   a second bus at a second elevation, extending along a second direction different from the first direction, and electrically connected to the first bus through a via;
   a first group of fingers at the first elevation and extending along the first direction; and
   a second group of fingers at the second elevation and extending along the second direction, wherein
   each finger of the first group of fingers is electrically connected to the second bus through a corresponding via,
   each finger of the second group of fingers is electrically connected to the first bus through a corresponding via, and
   each finger of the first group of fingers overlaps each finger of the second group of fingers.

2. The semiconductor device of claim 1, wherein the first MOM cell further comprises:
   a third bus at the first elevation, extending along the first direction, and overlapping the second bus;
   a fourth bus at the second elevation, extending along the second direction, overlapping the first bus, and electrically connected to the third bus through a via;
   a third group of fingers at the first elevation and extending along the first direction; and
   a fourth group of fingers at the second elevation and extending along the second direction, wherein
   each finger of the third group of fingers is electrically connected to the fourth bus through a corresponding via,
   each finger of the fourth group of fingers is electrically connected to the third bus through a corresponding via, and
   each finger of the third group of fingers overlaps each finger of the fourth group of fingers.

3. The semiconductor device of claim 2, wherein
   the first bus, the second bus, the first group of fingers, and the second group of fingers are configured to receive a first reference voltage, and
   the third bus, the fourth bus, the third group of fingers, and the fourth group of fingers are configured to receive a second reference voltage.

4. The semiconductor device of claim 2, wherein
   the fingers of the first group of fingers alternate with the fingers of the third group of fingers, and
   the fingers of the second group of fingers alternate with the fingers of the fourth group of fingers.

5. The semiconductor device of claim 2, wherein
   the first bus includes a first end overlapping with a portion of the second bus and a second end overlapping with a portion of the fourth bus from a top view perspective, and
   each finger of the first group of fingers includes a first end overlapping with a portion of the second bus and a second end spaced apart from the fourth bus from a top view perspective.

6. The semiconductor device of claim 2, wherein each of the first bus and each finger of the first group of fingers includes a first end overlapping with a portion of the second bus and a second end overlapping with a portion of the fourth bus from a top view perspective.

7. The semiconductor device of claim 2, wherein
   the first MOM cell further comprises a fifth bus at the second elevation and extending along the second direction, and
   the fifth bus is electrically connected to the first group of fingers.

8. The semiconductor device of claim 7, wherein
   the first MOM cell further comprises a sixth bus at the second elevation and extending along the second direction, and
   the sixth bus is electrically connected to the second groups of fingers.

9. The semiconductor device of claim 8, further comprising a second MOM cell abutting the first MOM cell, wherein the first MOM cell and the second MOM cell share the fourth bus, and the second MOM cell and the first MOM cell are mirror symmetric with respect to the fourth bus.

10. The semiconductor device of claim 2, further comprising a second MOM cell abutting the first MOM cell, wherein the first MOM cell and the second MOM cell share the fourth bus, and the second MOM cell and the first MOM cell are mirror symmetric with respect to the fourth bus.

11. The semiconductor device of claim 2, further comprising a second MOM cell abutting the first MOM cell, wherein the first MOM cell and the second MOM cell share the first bus, and the second MOM cell and the first MOM cell are mirror symmetric with respect to the first bus.

12. A semiconductor device, comprising:
   a first metal-oxide-metal (MOM) cell comprising:
   a first bus and a second bus at a first elevation and extending along a first direction;

a third bus and a fourth bus at a second elevation and extending along a second direction different from the first direction;

a first group of fingers alternating with a second group of fingers at the first elevation and extending along the first direction, all of which are disposed between the first bus and the second bus; and a third group of fingers alternating with a fourth group of fingers at the second elevation and extending along the second direction, all of which are disposed between the third bus and the fourth bus, wherein the first bus and the third bus are electrically connected through a via, the second bus and the fourth bus are electrically connected through a via, each finger of the first group of fingers is electrically connected to the third bus through a corresponding via, each finger of the second group of fingers is electrically connected to the fourth bus through a corresponding via, each finger of the third group of fingers is electrically connected to the first bus through a corresponding via, and each finger of the fourth group of fingers is electrically connected to the second bus through a corresponding via.

13. The semiconductor device of claim 12, wherein a first distance between a first finger of the first group of fingers and the second bus is equal to or exceeds a second distance between adjacent fingers of the first and second groups of fingers.

14. The semiconductor device of claim 13, wherein a third distance between a first finger of the third group of fingers and the fourth bus is equal to or exceeds a fourth distance between adjacent fingers of the third and fourth groups of fingers.

15. The semiconductor device of claim 12, wherein the first bus, the second bus, the third bus, and the fourth bus are each aligned with a cell boundary of the first MOM cell.

16. The semiconductor device of claim 12, wherein the first bus and the third bus are configured to receive a first reference voltage, and the second bus and the fourth bus are configured to receive a second reference voltage.

17. The semiconductor device of claim 12, further comprising a second MOM cell abutting the first MOM cell, wherein the first MOM cell and the second MOM cell share the fourth bus, and the second MOM cell and the first MOM cell are mirror symmetric with respect to the fourth bus.

18. A method of manufacturing a semiconductor device, the method comprising:

constructing first and second buses and first and second groups of fingers extending in a first direction at a first elevation, the first and second groups of fingers being between the first and second buses; and constructing third and fourth buses and third and fourth groups of fingers extending in a second direction at a second elevation, the third and fourth groups of fingers being between the third and fourth buses, wherein the third bus and third group of fingers are electrically connected through vias to the first bus and first group of fingers, and the fourth bus and fourth group of fingers are electrically connected through vias to the second bus and second group of fingers.

19. The method of claim 18, wherein the constructing the first and second groups of fingers comprises alternating the fingers of the first group of fingers with the fingers of the second group of fingers, and the constructing the third and fourth groups of fingers comprises alternating the fingers of the third group of fingers with the fingers of the fourth group of fingers.

20. The method of claim 18, further comprising:

constructing a first electrical connection between a first reference voltage path and the first and third buses and first and third groups of fingers; and constructing a second electrical connection between a second reference voltage path and the second and fourth buses and second and fourth groups of fingers.

\* \* \* \* \*